US007342470B2

(12) United States Patent
Bassali

(10) Patent No.: US 7,342,470 B2
(45) Date of Patent: Mar. 11, 2008

(54) CIRCUIT BOARD MICROWAVE FILTERS

(76) Inventor: Fred Bassali, 150-20 71st Ave., Apt. #3F, Kew Gardens Hills, NY (US) 11367

( * ) Notice: Subject to any disclaimer, the term of this patent is extended or adjusted under 35 U.S.C. 154(b) by 49 days.

(21) Appl. No.: 10/494,471

(22) PCT Filed: Nov. 4, 2002

(86) PCT No.: PCT/US02/38220

§ 371 (c)(1),
(2), (4) Date: Apr. 29, 2004

(87) PCT Pub. No.: WO03/041271

PCT Pub. Date: May 15, 2003

(65) Prior Publication Data

US 2004/0239452 A1 Dec. 2, 2004

Related U.S. Application Data

(60) Provisional application No. 60/338,087, filed on Nov. 2, 2001.

(51) Int. Cl.
*H01P 7/00* (2006.01)
*H01R 12/04* (2006.01)
*H05K 1/11* (2006.01)

(52) U.S. Cl. .................. 333/219; 333/219.1; 174/262; 174/265

(58) Field of Classification Search ................ 174/261; 333/202, 206, 219, 219.1, 222
See application file for complete search history.

(56) References Cited

U.S. PATENT DOCUMENTS

| | | | | |
|---|---|---|---|---|
| 4,463,330 | A | 7/1984 | Yoneyama | 333/239 |
| 5,172,084 | A | 12/1992 | Fiedziuszko et al. | 333/204 |
| 5,705,966 | A | 1/1998 | Carmi | 333/219 |
| 5,736,679 | A * | 4/1998 | Kresge et al. | 174/250 |
| 6,609,297 | B1 * | 8/2003 | Hiramatsu et al. | 29/852 |
| 6,930,258 | B1 * | 8/2005 | Kawasaki et al. | 174/264 |

* cited by examiner

*Primary Examiner*—Tuan Dinh
*Assistant Examiner*—Ivan Carpio
(74) *Attorney, Agent, or Firm*—Sofer & Haran, LLP

(57) ABSTRACT

A microwave filter has resonator comprised of a cylindrical structure having conductive walls filled with a dielectric material where the cylindrical structure is recessed inside a multi-layered substrate. First and second conductive coupling arms are disposed on a top layer of the substrate for coupling signals to the cylindrical structure. The conductive coupling arms are separated by a dielectric layer. The first and second conductive coupling arms extend away from the center of the cylindrical structure to form a microstrip line. The cylindrical structure further comprises a bottom portion having a solid conductive bottom plate perpendicular to the axis of the cylinder and a bottom conductive ground layer separated from the conductive bottom plate by a second dielectric layer.

23 Claims, 26 Drawing Sheets

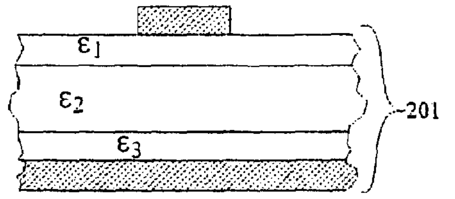
Fig. 2a Three layer composite microstrip line
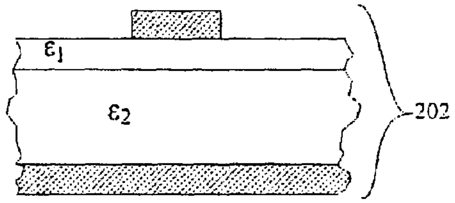
Fig. 2b Two layer composite microstrip line
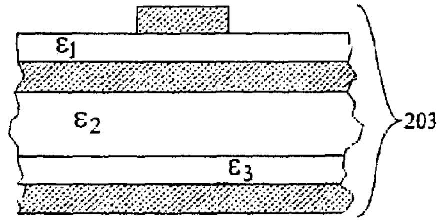
Fig. 2c Simple microstrip on top
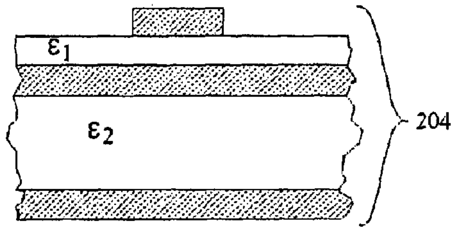
Fig. 2d Simple microstrip above a dielectric layer and ground on the bottom
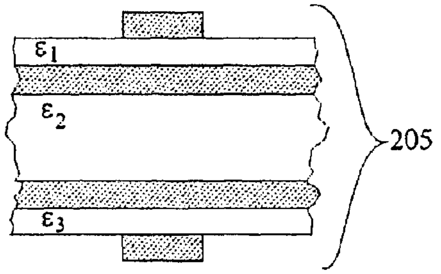
Fig. 2e Simple microstrip on top separated by a dielectric layer from another microstrip on bottom

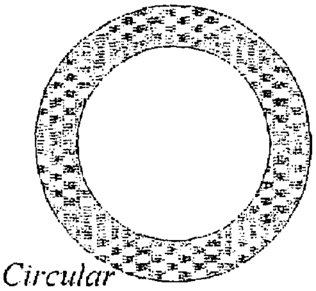
Fig. 4a
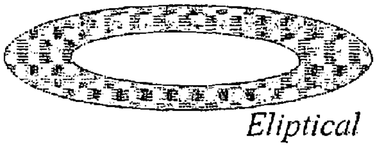
Fig. 4b
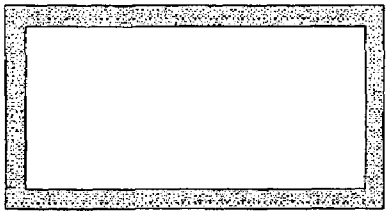
Fig. 4c
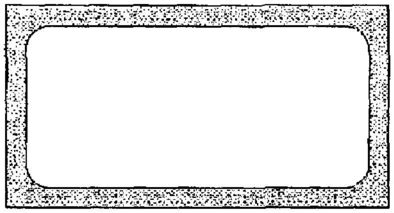
Fig. 4d
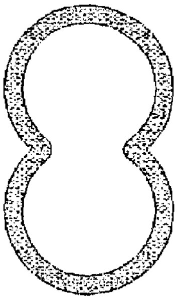
Fig. 4e
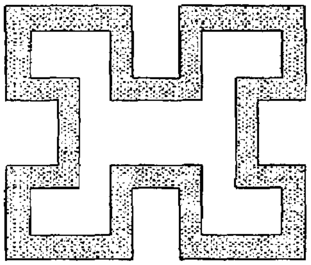
Fig. 4f Quadruple - Ridged
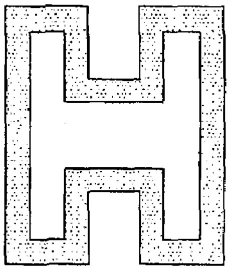
Fig. 4g Double - Ridged
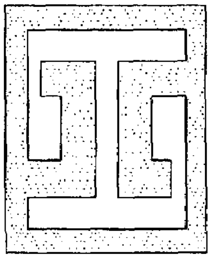
Fig. 4h Higly capacitive Double - Ridged
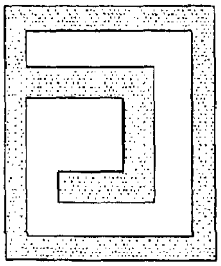
Fig. 4i Higly capacitive Single - Ridged

CIRCUIT BOARD MICROWAVE FILTERS

RELATED APPLICATION

This application claims priority from a previously filed United States provisional application entitled CIRCUIT BOARD MICROWAVE FILTERS filed on Nov. 2, 2001, application Ser. No. 60/338,087 and is incorporated herein by reference.

FIELD OF THE INVENTION

This invention relates to an Radio Frequency spectrum structure and more specifically to circuit boards/substratemicrowave filter employs a resonator structure

BACKGROUND OF THE INVENTION

Microwave and RF filters are common components of communication devices. Both transmitters and receivers use filters for rejection of signals in the unwanted frequency bands. A major application of such filters is in the cellular/PCS phones. The most commonly used filter for cellular/PCS application is the coaxial ceramic type in which several coaxial ceramic resonators with very high relative dielectric constants are coupled to each other. These filters often are installed on top of circuit board and substantially increase height to the board thickness. As a result the filters are one of the components that restrict the implementation of a thin cell/PCS phones. Multi-layer circuit board with several layers of dielectric material and plated through blind via holes have become a common technology used in the cellular telephone handsets.

With the advent of Monolithic Microwave/millimeter wave Integrated Circuits (MMIC, MmmwIC) the needs for implementing high performance/space efficient filters have been increasing. The semiconductor substrate real estate especially material suitable for microwave/millimeter wave applications (e.g., GaAs) is costly and restrictive. Filters are often implemented off the chip. There is a great demand for means providing size reduction leading to cost efficient on chip implementation of filters.

SUMMARY OF THE INVENTION

A new RF/Microwave filter using a novel resonator is introduced. The resonator is composed of a plated through hole implemented (cylindrical with circular or any arbitrary cross section) similar to a via hole and extra onboard metalization implemented in various possible layers of a circuit board or any form of substrate.

The conductive cylinder is separated by a dielectric layer on top and on the bottom when necessary. Inside the cylinder is filled up with dielectric material or hollow. Almost any type of transmission line which can be implemented on a circuit board or a substrate can be utilized.

Various type of transmission lines such as described in can be employed signals carried by these transmission lines are coupled to the novel resonator of the present invention.

In addition a new type of microstrip line called composite microstrip line can be utilized which is suitable for certain types of implementation. In the integrated circuit technology where the height of dielectric layers are limited the alternative transmission line types such as slot lines are often implemented.

In accordance with other embodiment of the invention the resonator circuit is employed to function as part of a resonator for other microwave components such as oscillators, power dividers, and baluns.

This invention provides the means to build RF/microwave/mm wave components including filter using a novel resonator on a multi-layer board or on substrate in order to avoid external filters and their associated cost and size by means of using composite microstrip lines, combination of simple microstrip lines, or other types of the transmission lines.

Depending on dimensions and the relevant frequencies, plated through holes could be considered as lumped inductive elements, evanescent mode waveguide or propagating waveguide. In all the three mentioned cases the plated through holes provide inductive reactance needed for resonance condition.

Band pass filters are the most common type of filters used in communications. Usually in order to obtain rejection outside of the pass band of the filter, multi-section filters are required. Each section is a resonator which an LC equivalent circuit is obtainable. In this invention the cylindrical structure mainly provides the inductive portion of the resonance and the capacitive components are constructed via the any two conductors separated via dielectrics or hollow space between them.

BRIEF DESCRIPTION OF DRAWINGS

FIGS. 1-*a* through 1-*j* illustrate various exemplary standard transmission lines that are usable in this invention and to couple energy to a resonator structure in accordance with various embodiment of the present invention taken from.

FIGS. 2-*a* and 2-*e* depict multi layered board/substrate usable for various embodiment of this invention.

FIG. 4 depicts various exemplary cross sectional view of cylindrical structures usable for various embodiment of this invention.

DETAILED DESCRIPTION OF THE DRAWINGS

FIG. 1-*a* through FIG. 1-*j* depict the cross section of a variety of types of transmission lines taken from the reference K. C. Gupta, Ramesh Garg, I. J. Bahl, "MICROSTRIP LINES and SLOT LINES", Copyright © 1979 by Artech House, Inc., pages 1-3, the entirety of which is incorporated herein reference. FIGS. 1-*a* through 1-*j* illustrate various exemplary standard transmission lines that are usable in this invention and to couple energy to a resonator structure in accordance with various embodiment of the present invention taken from.

FIG. 1-*a* depicts the cross section of a microstrip line.

FIG. 1-*b* depicts the cross section of a slotstrip line.

FIG. 1-*c* depicts the cross section of a coplanar waveguide.

FIG. 1-*d* depicts the cross section of a coplanar strips.

FIG. 1-*e* depicts the cross section of an inverted microstrip line.

FIG. 1-*f* depicts the cross section of a suspended microstrip line.

FIG. 1-*g* depicts the cross section of a microstrip line with overlay.

FIG. 1-*h* depicts the cross section of a strip dielectric wave guide.

FIG. 1-*i* depicts the cross section of an inverted strip dielectric wave guide.

FIG. 1-*j* depicts the cross section of an inverted stripline.

FIGS. 2-*a* through 2-*e* depict multi layered board/substrate usable for various embodiment of this invention.

FIG. 2-*a* illustrates a multi-layered substrate 201, is composed of three-layers of dielectric located between a ground plane underneath and a narrow conductive strip above forms a "three-layered composite microstrip line".

FIG. 2-*b* illustrates a multi-layered substrate 202, is composed of two layers of dielectric located between a ground plane underneath and a narrow conductive strip above forms a "two-layered composite microstrip line".

FIG. 2-*c* illustrates a multi-layered substrate 203, is composed of three-layers of dielectric and three conductive layers, wherein a ground plane is on the bottom and a narrow conductive strip on top and a layer of dielectric separates the top and the intermediate conductive layer referred to as the "intermediate ground plane".

FIG. 2-*d* illustrates a multi-layered substrate 203, is composed of three-layers of dielectric and four conductive layers, wherein the conductive layers and dielectric layers are alternatively located and as a result simple microstrip lines could be formed by any two consecutive conductors.

Figure 1A:
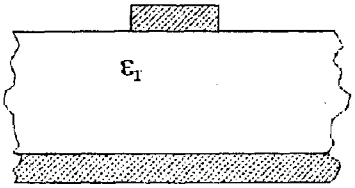
Figure 1B:
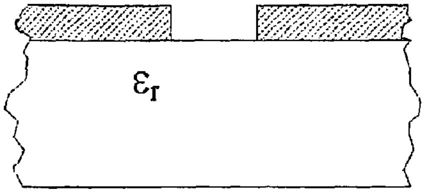
Figure 1C:
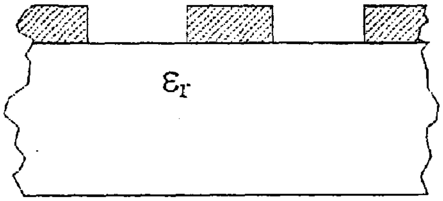
Figure 1D:
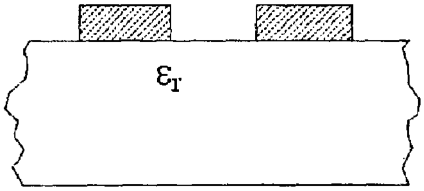
Figure 1E:
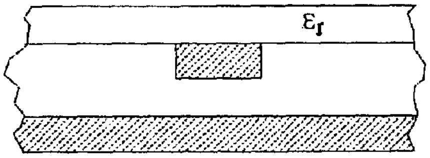
Figure 1F:
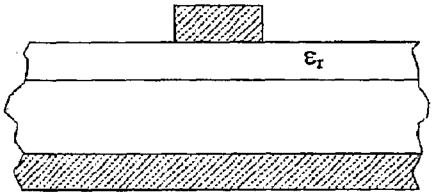
Figure 1G:
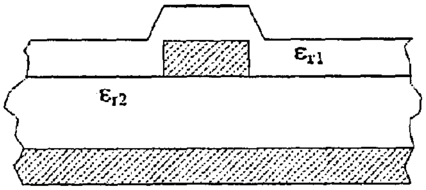
Figure 1H:
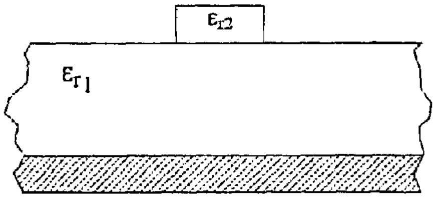
Figure 1I:
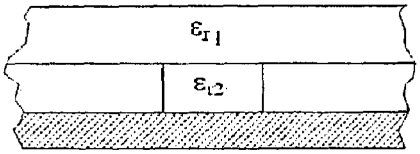
Figure 1J:
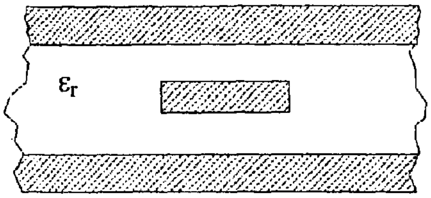
Figure 3:
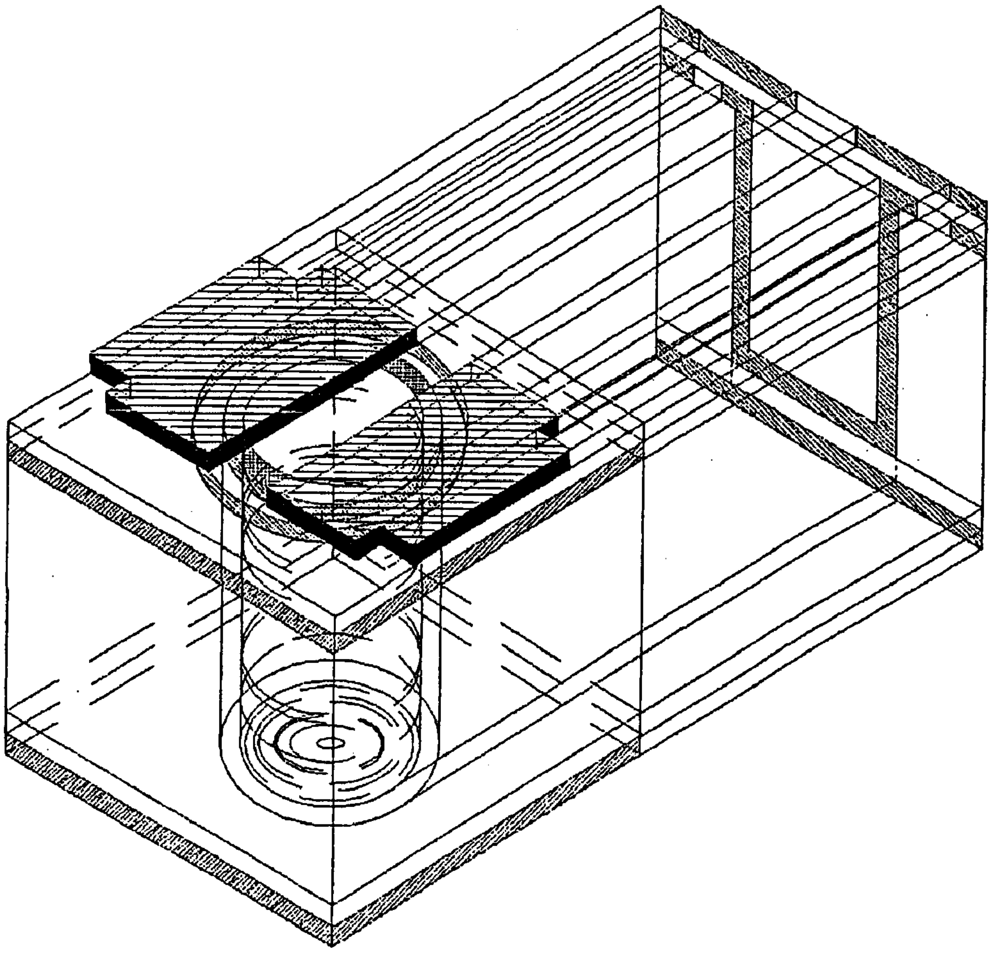
FIG. 3 is depicts a three dimensional view of a bandpass resonator

FIG. 3 is depicts a three dimensional view of an exemplary embodiment of the invention, a bandpass resonator using 203 type of multi-layered substrate, a cylindrical structure with a circular cross section located vertically.

FIG. 4-*a* through 4F depict various exemplary cross sectional view of cylindrical structures usable for various embodiment of this invention.

FIG. 4-*a* depicts a circular cross section.

FIG. 4-*b* depicts an elliptical cross section.

FIG. 4-*c* depicts a rectangular cross section.

FIG. 4-*d* depicts a rectangular cross section with round corners which is easy to manufacture in the printed circuit board technology.

FIG. 4-*e* depicts a double-circular cross section.

FIG. 4-*f* depicts a quadruple ridged cross section.

FIG. 4-*g* depicts a double ridged cross section.

FIG. 4-*h* depicts a highly capacitive double ridged cross section.

FIG. 4-*h* depicts a highly capacitive quadruple ridged cross section.

Figure 5A:
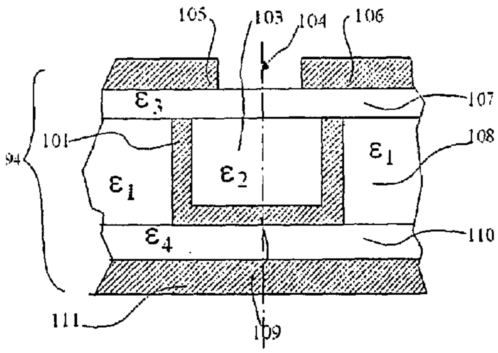
FIG. 5 through are front view, side view and top view of exemplary resonator.
Figure 5B:
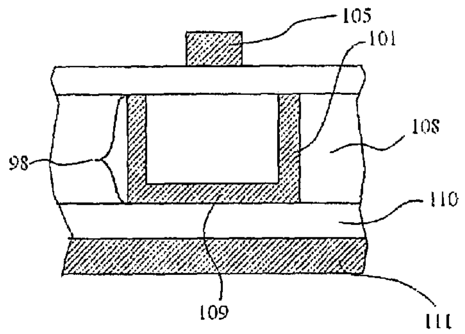

FIGS. 5-*a* and 5*b* illustrate a resonator structure 100 in accordance with one embodiment of the invention.

The resonator is composed of a cylindrical structure 98 with conductive walls 101, which is filled up with dielectric material or air or hollow 103 although the invention is not limited in the scope in that respect. For example as will be discussed in more detail later cylindrical structure 98 can be filled up with a conductive material.

Cylindrical structure 98 is recessed inside a multi-layered substrate. FIG. 3*a*-3*e* illustrate various multi-layered substrates such as 201, 202, 203, 204, 205. A multi-layered substrate is an arrangement that contains The cylindrical structure has an arbitrary type of cross section such as those illustrated in FIG. 4. The axis 104 of the cylindrical structure is perpendicular to the layers of the substrate. The top layer contains two conductive coupling arms 105, 106 which are utilized for coupling of signal into and from the cylindrical structure. The coupling arms 105 and 106 are both located above the cylindrical structure are situated very close to the top of the cylindrical structure and are symmetrical with respect to the axis of the cylinder and are separated by a dielectric layer.

The cylindrical structure 98 extends down into the substrate 108 and at its lowest portion has a solid conductive bottom plate 109 perpendicular to the axis of cylinder.

The conductive bottom plate 109 is separated from a bottom conductive ground layer 111 by another dielectric layer 110 or is part of the bottom conductive ground layer of 111. Each conductive coupling arm 105/106 are located on the opposite sides with respect to the axis of cylinder and are extending away from the center of the structure into the space above the substrate forming a microstrip 96 such as the one illustrated in FIG. 11 or a composite microstrip structure 94 such as the one illustrated in FIG. 5*a* in conjunction with dielectric layers 107, 108 and 110 of the a multi-layer substrate.

Partly, or entirely the extensions 112 and 113 of microstrip structure 96 or composite microstrip structure 94 above dielectric layers 107, 108 and 110 constitute other reactive elements such as shunt or series reactive elements or their combination in order to provide the required resonance condition at the appropriate impedance level and coupling to the next resonator or input/output port of the filter or RF/microwave/mm wave component. Examples of reactive elements are shunt capacitors, formed by widening microstrip line/composite microstrip line, series capacitors formed by overlay capacitor, inter-digital capacitor, microstrip/composite microstripline gap, or an external components attached, etc, and series inductor formed by a narrow microstrip line/composite microstrip line with straight or curved or zigzaged or shunt inductor formed by one or a combination of shorted microstrip line(s)/composite microstrip line(s) with straight or curved or zigzaged.

FIG. 5-*a* and FIG. 5-*b* depict two cross sectional view of a possible embodiment of the invention wherein the composite microstrip line is composed of three layers and the bottom plate 109 is separated from the bottom ground layer 111 by a dielectric layer 110.

Figure 6:
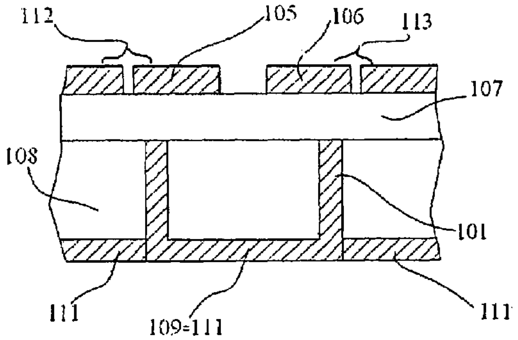
FIG. 6 depicts a cross sectional view of an implementation of the invention in which the bottom plate of the resonator is part of the bottom ground layer.

FIG. 6 depicts a cross sectional view of a possible embodiment of the invention in which the bottom plate 109 is part of the bottom ground layer 111.

Figure 7:
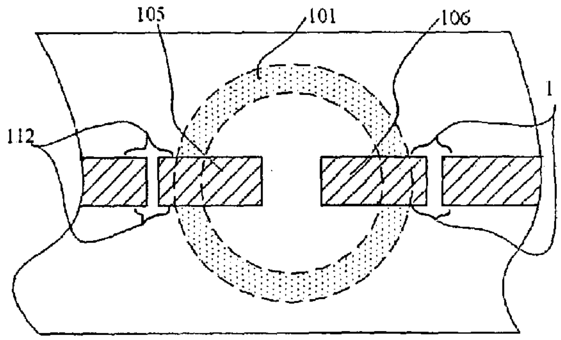
FIG. 7 depicts a possible top view of a resonator of FIGS. 5 and 6 where a series capacitor is implemented by introduction of a gap in the microstrip lines on each side of the resonator.

FIG. 7 depicts a possible top view of a resonator of FIGS. 5 and 6 where a series capacitor is implemented by introduction of a gap in the microstrip lines on each side of the resonator.

Figure 8:
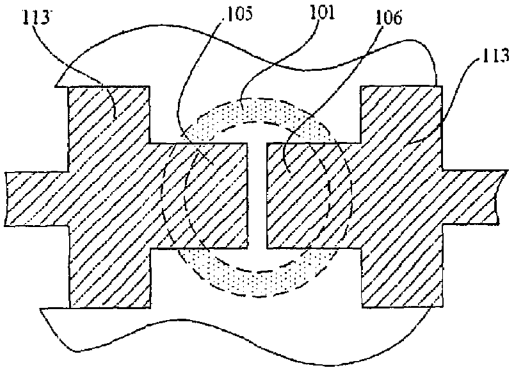
FIG. 8 depicts a possible top view of the resonators of FIG. 5*a*, FIG. 5*b* and FIG. 6 wherein a shunt capacitor is implemented on each side of the resonator by introducing a wide microstrip line on each side of the resonator.

FIG. 8 depicts a portion of a possible top view of the resonators of FIGS. 5 and 6 where shunt capacitors are implemented by introducing a wide microstrip line(s) and on each side of the resonator.

Figure 9:
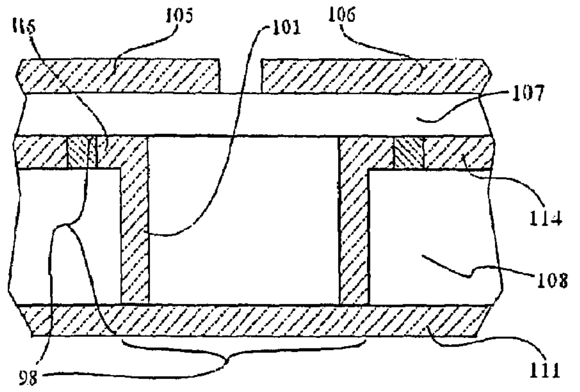
FIG. 9 depicts the vertical cross section view of a preferred embodiment of the resonator wherein an additional conductive annular ring is added to the top of conductive cylinder and an additional conductive intermediate ground layer which is in the same plane located in the same pale as the annular ring. The intermediate ground plane is located underneath the top dielectric layer.

FIG. 9 depicts a cross sectional view of a possible embodiment of the invented resonator in which an addition conductive ground layer 114 is underneath the dielectric layer 107. As a result the conductors in the top layer i.e., the continuation of the coupling arms 112 and 113 outside of the areas above the cylindrical structure 98 and this additional ground layer 114, form a microstrip line structure. The use of this type of microstrip line structure is to keep the signal energy above the cylindrical structure above the conductive cylindrical wall, in order to eliminate reflection by cylinder wall which could occur in the composite microstrip type of substrate.

FIGS. 9, 10, 11, 12, 13, 14, 15 depict addition of a conductive annular ring 115 to the top edge of the conductive cylindrical wall 101 in order to obtain more capacitance between the coupling arms 105,106 and the cylinder 101.

Figure 11:
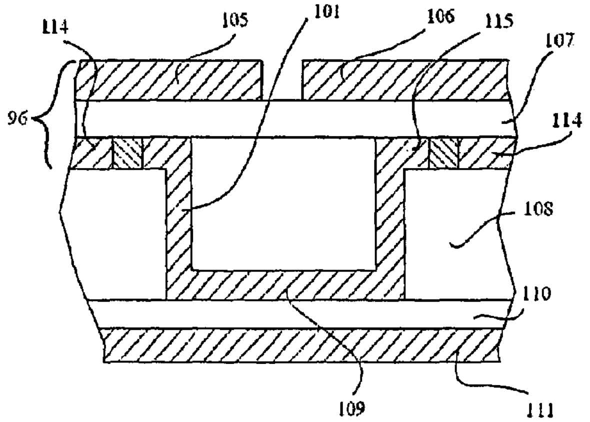
FIG. 11 depicts another preferred embodiment of the invention in which the annular ring similar to FIG. 9 is utilized. However, an additional dielectric layer is added underneath the cylindrical resonator to separate the resonator from the bottom ground plane. The top view of this implementation is depicted in FIG. 11.

FIG. 11 depicts another embodiment of the invention in which the annular ring 115 is utilized and the cylinder bottom plate 109 is separated from the bottom ground layer 111 by the dielectric layer 110 and also, an addition conductive ground layer 114 underneath the dielectric layer 107 for reduced reflection from the conductive cylinder wall 101.

Figure 10:
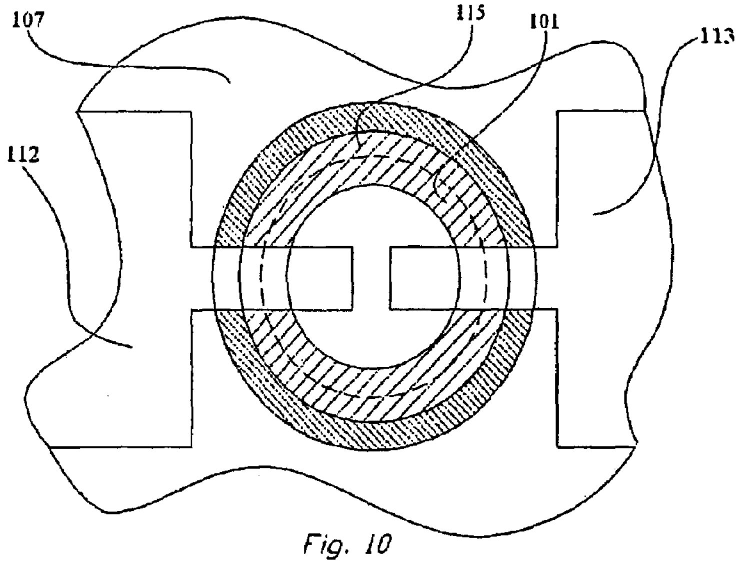
FIG. 10 depicts a possible top view for FIGS. 9 and 11 wherein, the top view of a resonator which includes an annular ring.

FIG. 10 depicts a possible top view for FIGS. 9 and 11.

Figure 12:
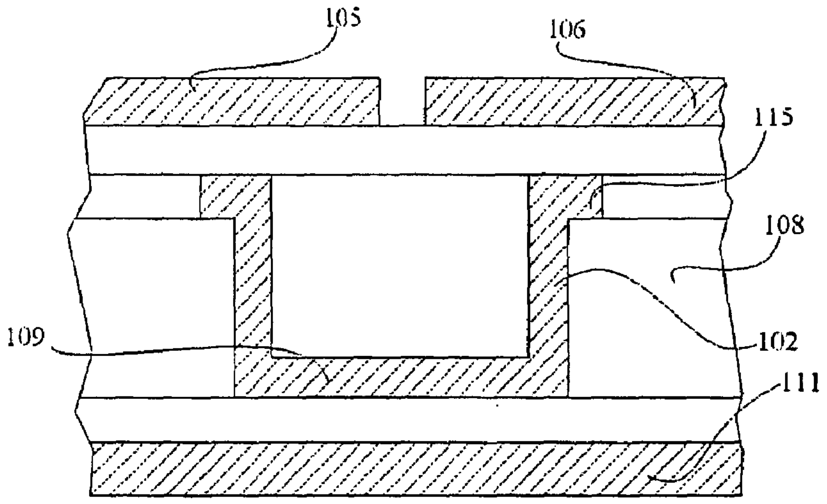
FIG. 12 depicts the vertical cross section for another preferred implementation of a resonator according to the present invention wherein there is a strong coupling from wide conductive coupling arms and their extension outside of the area above the cylinder. Additional coupling is obtained by utilizing an annular ring located at the top of the conductive cylinder from wide conductive coupling arms and their extension outside of the area above the cylinder.
Figure 13:
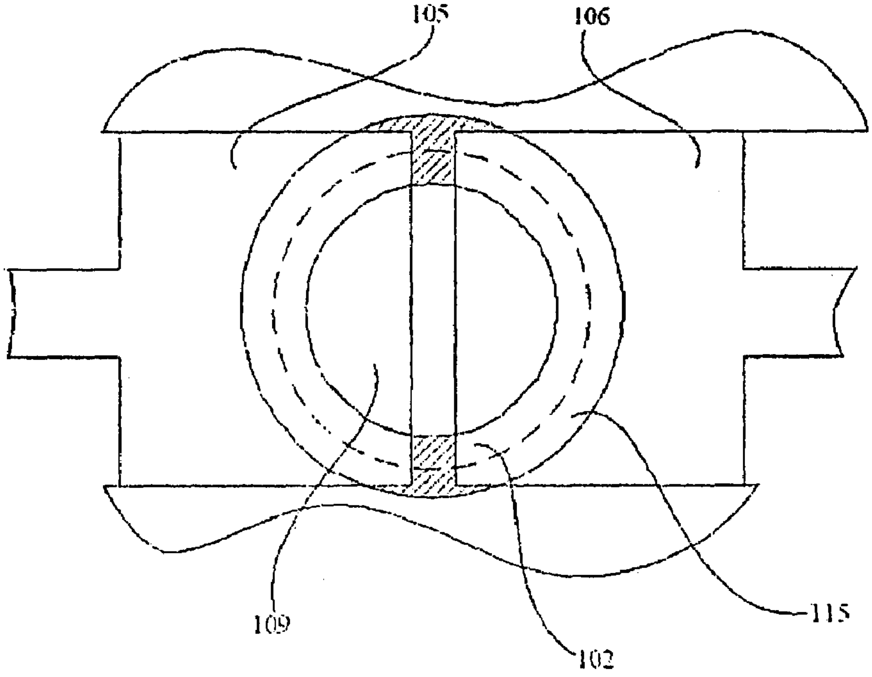
FIG. 13 depicts the top view for the resonator as depicted in FIG. 12.

FIGS. 12 and 13 depict an embodiment of the invention with strong coupling from wide conductive coupling arm 105/106 and their extension outside of the area above the cylinder.

Figure 14:
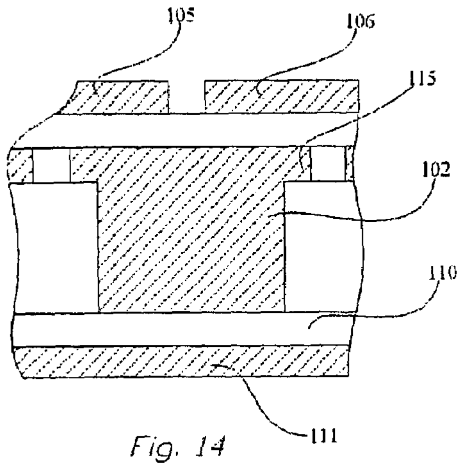
FIG. 14 depicts a vertical cross section view for another implementation for the resonator according to a preferred invention wherein strong coupling to the resonator is produced by selecting wide conductive coupling arms and their extension outside of the area above the cylinder and utilizing a cylinder which is filled with conductor. Additional coupling is obtained by utilizing an annular ring located at the top of the conductive cylinder and wide conductive coupling arms and their extension outside of the area above the cylinder.
Figure 15:
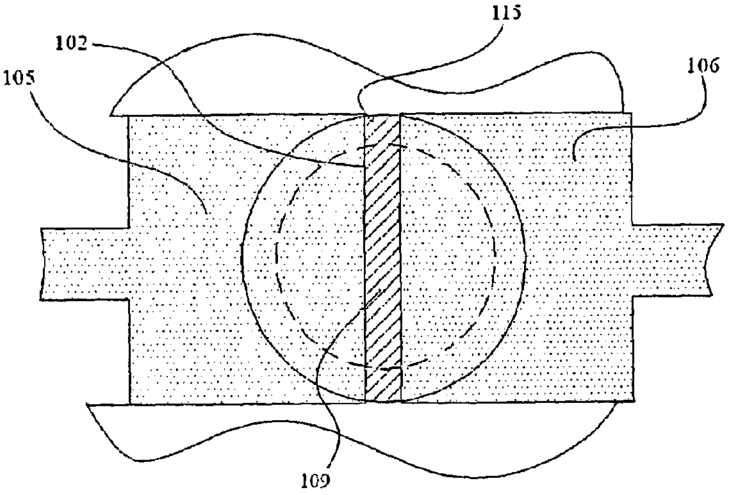
FIG. 15 depicts the top view for the resonator of FIG. 14.
Figure 16:
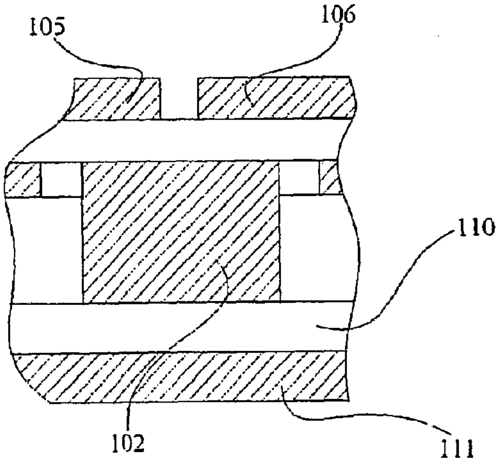
FIG. 16 depicts a vertical cross section view for another implementation for the resonator according to a preferred invention wherein strong coupling to the resonator is produced by selecting wide conductive coupling arms and their extension outside of the area above the cylinder and utilizing a cylinder which is filled with conductor.

FIGS. 14, 15 and 16 depict an embodiment of the invention with strong coupling from wide conductive coupling arm 105/106 and their extension outside of the area above the cylinder. FIGS. 14 and 16 both have a conductive top in order to obtain more capacitance between the coupling arms and the cylindrical wall.

Figure 17:
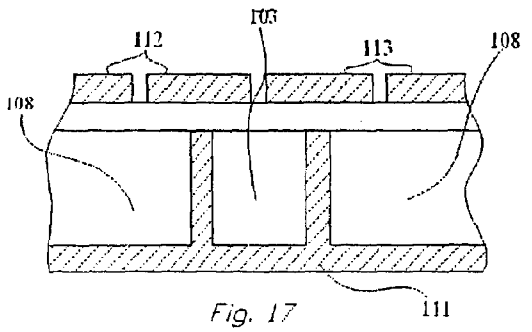
FIG. 17 depicts a vertical cross section view of resonator which has is composed of a hollow conductive cylinder.
Figure 18:
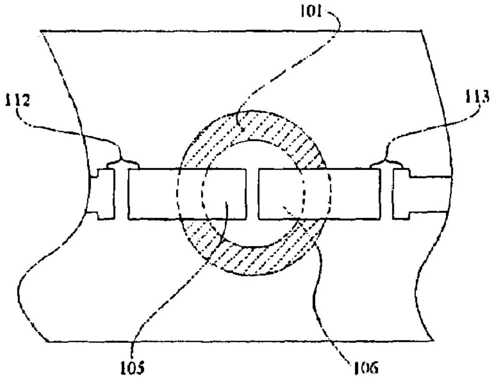
FIGS. 18, 19 are possible top views for FIG. 17 or other implementations wherein the cross sections of the cylinders is circular as depicted in FIG. 18 or the cross sections of the cylinders is rectangular as depicted in FIG. 19.
Figure 19:
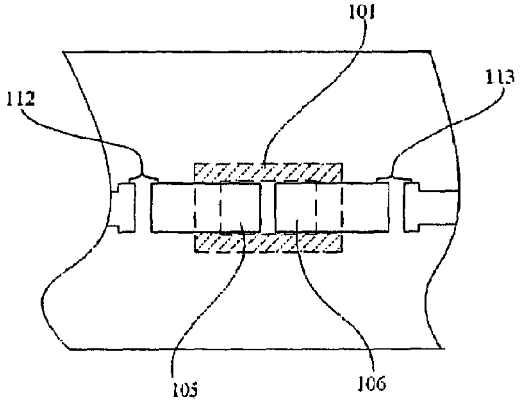
Figure 20:
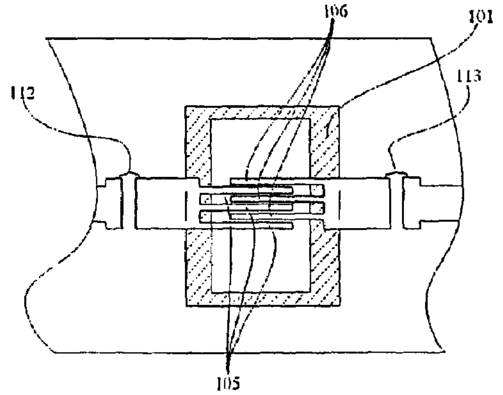
FIG. 20 depicts the top view for a resonator wherein the coupling arms have strong coupling to each other by use of an inter digital arms producing inter digital capacitor.

FIGS. 18, 19 are possible top views for FIG. 17. FIG. 17 & FIG. 18 depicts a circular cross section for the conductive cylindrical wall 101. FIGS. 19 and 20 depict a rectangular cross section for the conductive cylindrical wall 101. FIG. 19 depicts rectangular conductive coupling arm 105/106 separated by a simple gap located at the center of the cylindrical structure and perpendicular to the direction of the axes of the conductive coupling arm 105/106.

FIG. 20 depicts rectangular conductive coupling arm 105/106 are strongly coupled to each other by use of an inter-digital capacitor.

Figure 21:
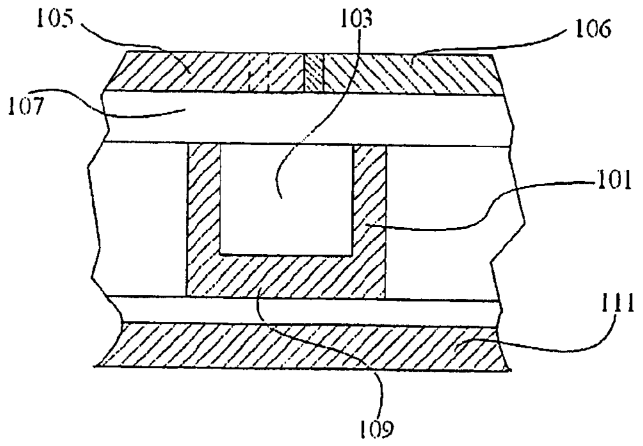
FIG. 21 depicts a vertical cross section view for a resonator wherein conducive coupling arms have a slanted (diagonal) gap.
Figure 22:
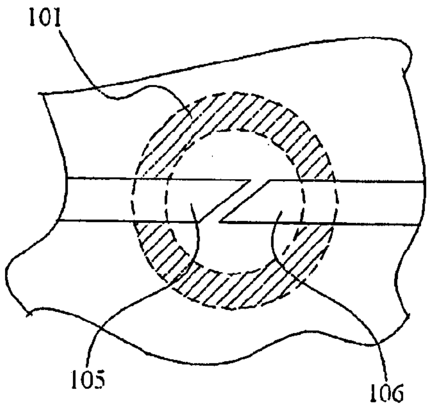
FIG. 22 depicts the top view for a resonator wherein conductive coupling arms have a slanted (diagonal) gap.

FIGS. 21 and 22 depict conductive coupling arms 105/106 have a slanted (diagonal) gap.

Figure 23:
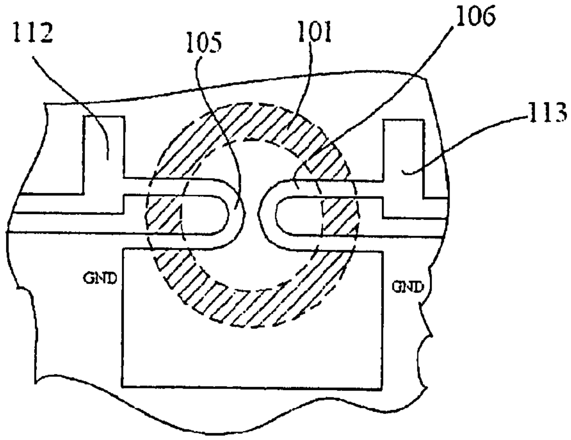
FIG. 23 depicts the top view for a resonator wherein conductive coupling arms which are coupling energy to the cylinder structure are implemented by loop coupling.

FIG. 23 depicts conductive coupling arms 105/106, which are coupling energy to the cylindrical structure by loop coupling.

Figure 24:
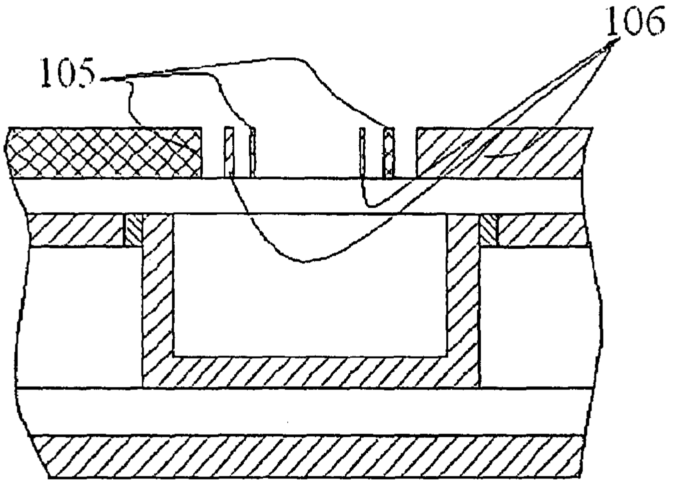
FIG. 24 depicts a vertical cross section view for a resonator wherein the conductive coupling arms are spiral shape and rotate one around the other.
Figure 25:
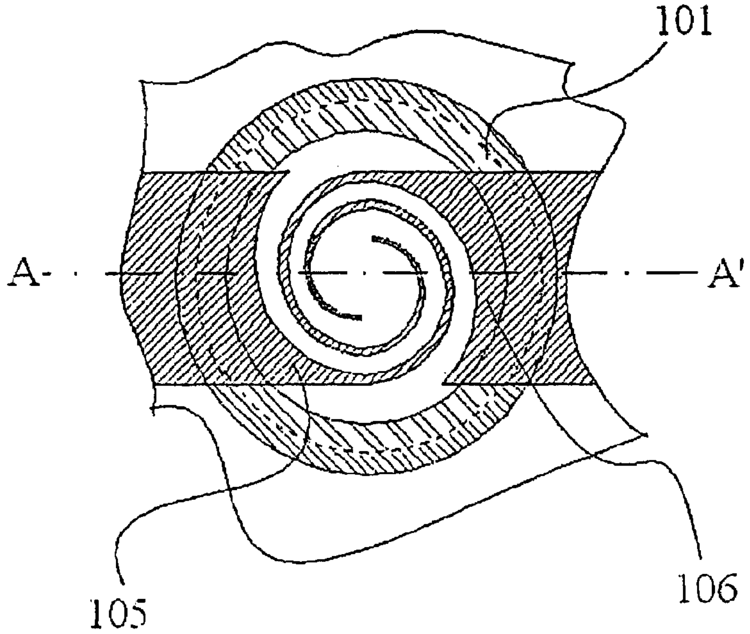
FIG. 25 depicts the top view for a resonator wherein the conductive coupling arms are spiral shape and rotate one around the other.

FIGS. 24 and 25 depict each of the conductive coupling arms 105/106, which are spiral and rotates around the other in order to obtain strong coupling In another embodiment of the invention, a transmission resonator 92 (as opposed to reflection type discussed up to this point) wherein the resonator incorporates a transmission type of cylindrical structure 98 recessed in a multi layered 205 substrate which the conductive cylinder wall 101 is open at both ends and there is no bottom conducting plate for reflection of signals. The substrate is composed of three dielectric layers 107, 108, 110 and four conductive layers. The top conductive layer contains the conductive coupling arm 105 its extension 112 and ground plane 131. The top intermediate conductive 130 is separated from the top conductive containing the conductive coupling arm 105 its extension 112 and ground plane 131 ground by a dielectric layer 107. Similarly, the bottom conductive layer contains the conductive coupling arm 106 its extension 113 and ground plane 111. The bottom intermediate conductive 132 is separated from the top conductive containing the conductive coupling arm 105 its extension 112 and ground plane 131 ground by a dielectric layer 110. The middle dielectric layer 108 is between the two intermediate ground layers 132 and 130 and contain the conductive cylinder wall 101. Depending on the type of coupling of resonator coupling the extensions 112 and 113, the intermediate ground layers 130 and 132 possibly connected to the conductive cylinder wall 101. Therefore the space 129 located between the intermediate ground plane 130 and the conductive cylinder wall 101 or space 128 located between the intermediate ground plane 132 and the conductive cylinder wall 101 in certain implementations could be conductive.

Examples of the transmission resonator are depicted in FIGS. 26, 27, 28, 29, 30, 31, 32, 33, 34.

Figure 26:
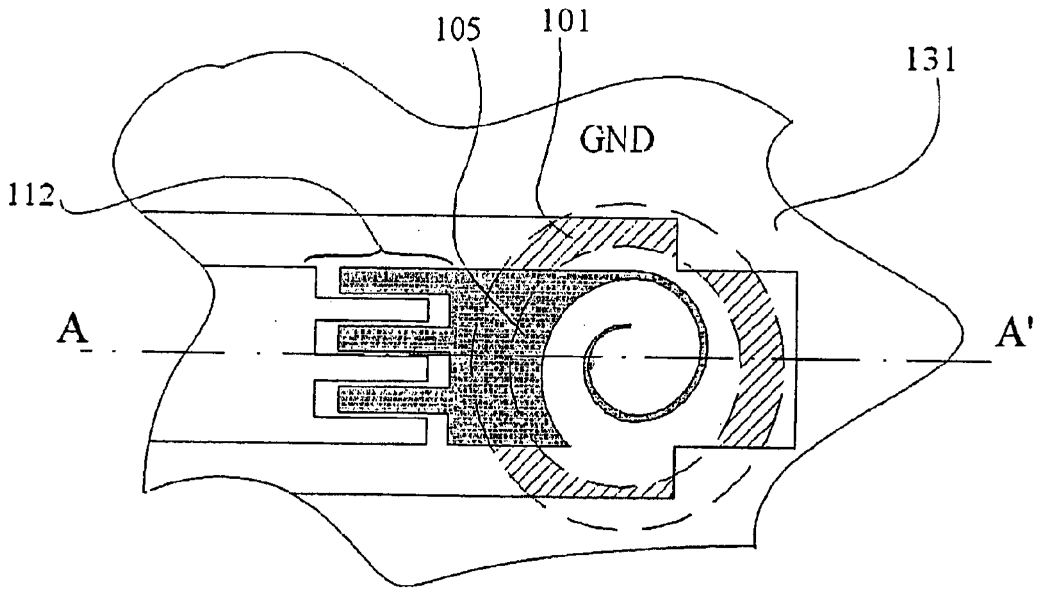
FIG. 26 depicts a top or a bottom view for a resonator wherein a transmission resonator is implemented in which a spiral conductive coupling arm from the top plane is coupled to a transmission resonator coupling energy to another to a coupling arm on the bottom. The coupling arms above and below the cylinder have spiral shape. The are inter-digital capacitors on each coupling arm.
Figure 27:
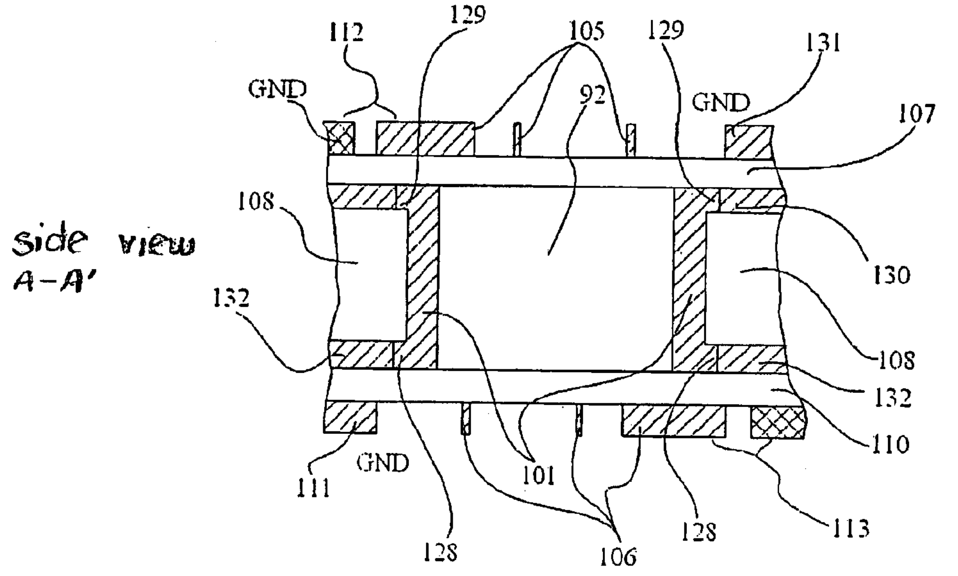
FIG. 27 depicts a vertical cross section for the resonator as depicted in FIG. 26.

FIGS. 26, 27 depict a transmission resonator in which a spiral conductive coupling arm 105 coupled to a transmission resonator 92. The signal is coupled to the coupling arm via an interdigital capacitor 112 from a microstrip line located on the top layer. The signal is coupled out of from the bottom side of cylindrical structure 98 a spiral arm 106 through the inter-digital capacitor 113 to the out put microstrip line.

Figure 28:
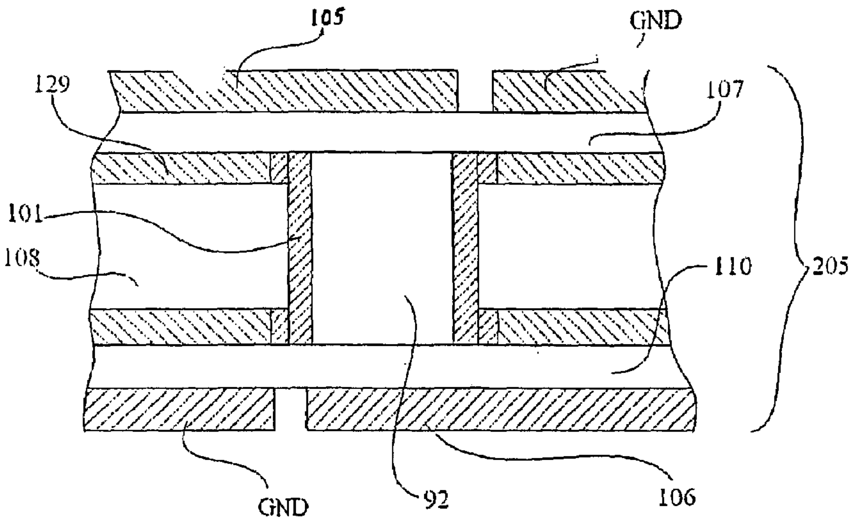
FIG. 28 depicts a top or a bottom view for a resonator wherein a transmission resonator is implemented in which a conductive coupling arm from the top plane is coupled to a transmission resonator coupling energy to another to a coupling arm on the bottom. The coupling arms above and below the cylinder have rectangular shape.
Figure 29:
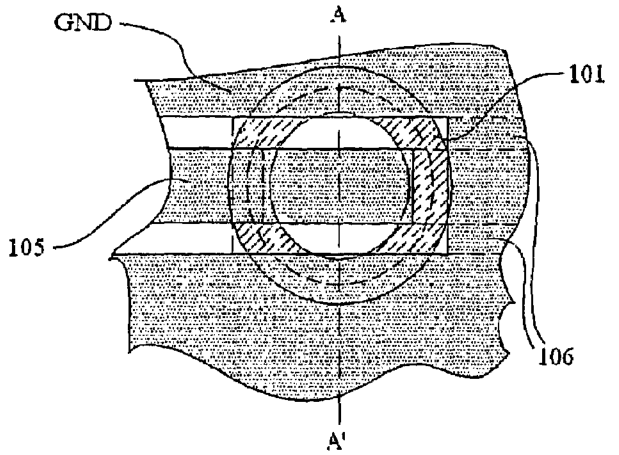
FIG. 29 depicts a vertical cross section for the resonator as depicted in FIG. 29.

FIGS. 28, 29 depict a transmission resonator in which a straight conductive coupling arm 105 coupled to a transmission resonator 92. The signal is coupled out of from the bottom side of cylindrical structure 92 a via a straight conductive arm 106 out of the structure through the inter-digital capacitor 113 to the output microstrip line.

Figure 30:
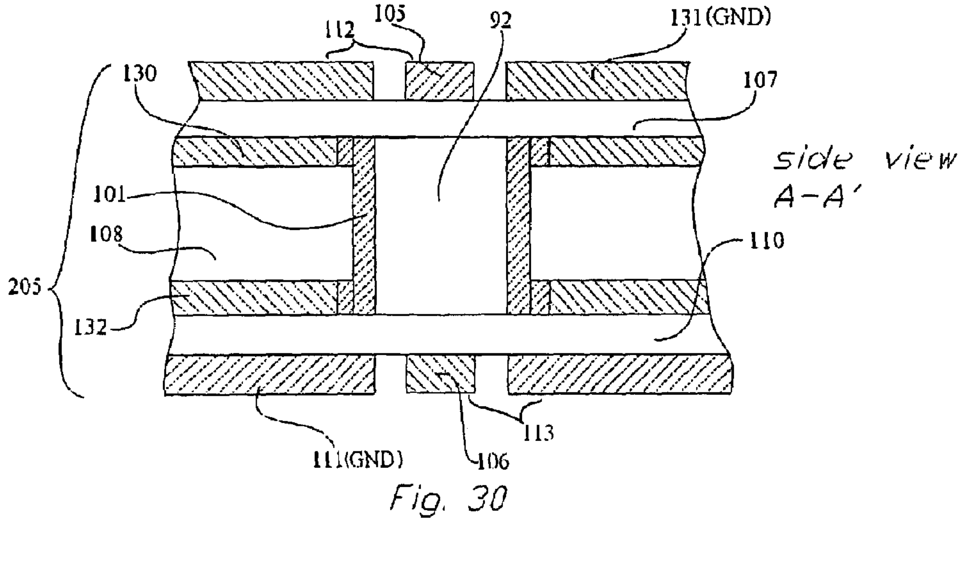
FIG. 30 depicts a vertical cross section for a transmission resonator wherein the signal is coupled to the coupling arm via an microstrip gap capacitor from a microstrip line located on the top layer which couples signal to a straight conductive coupling arm on the same layer top which in turn the signal is coupled to a transmission resonator. The signal is coupled out of from the bottom side of cylindrical structure via a straight coupling arm through the microstrip gap capacitor to the out put microstrip line.

FIG. 30 depicts a transmission resonator in which a straight conductive coupling arm 105 coupled to a transmission resonator 92. The signal is coupled to the coupling arm via an microstrip gap capacitor 112 from a microstrip line located on the top layer. The signal is coupled out of from the bottom side of cylindrical structure 98 a straight arm 106 through the microstrip gap capacitor 113 to the output microstrip line.

Figure 31:
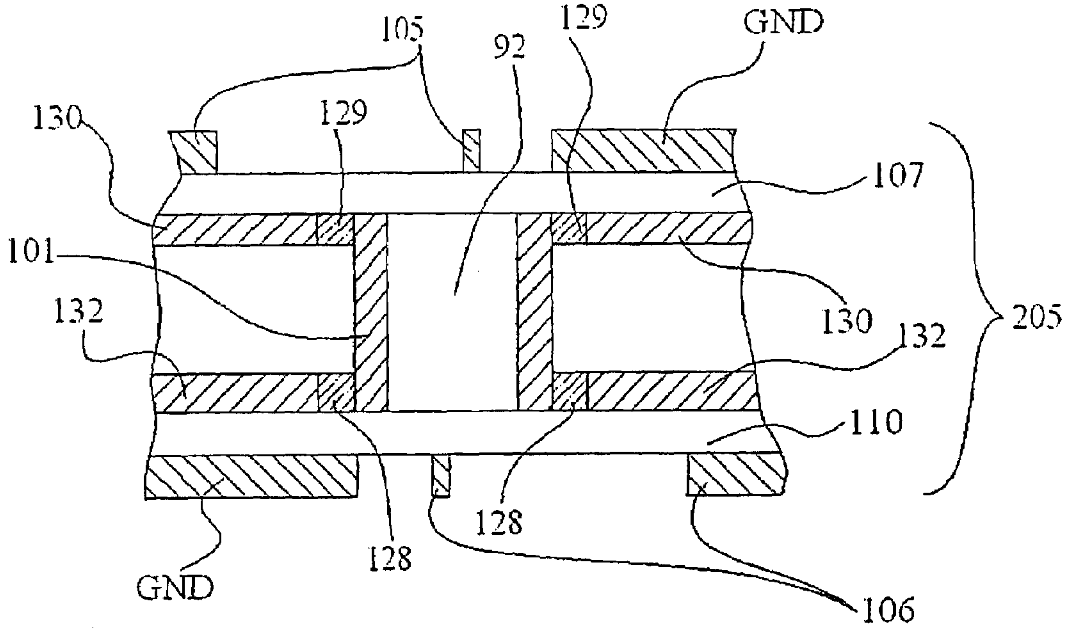
FIG. 31 depicts a vertical cross section for a transmission resonator wherein the signal is coupled to the coupling arm is a loop located on the top layer which couples signal to a straight conductive coupling arm on the same layer top which in turn the signal is coupled to a transmission resonator. The signal is coupled out of from the bottom side of cylindrical structure via loop coupling arm through the microstrip output microstrip line.
Figure 32:
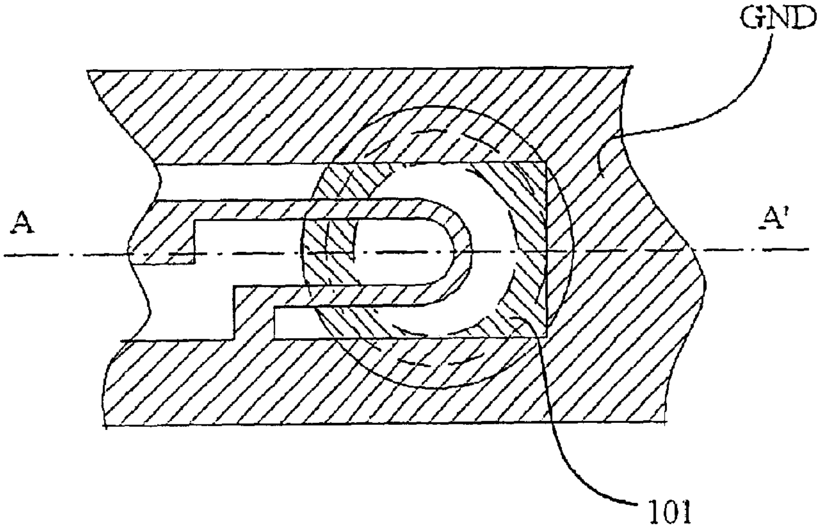
FIG. 32 depicts the top and / or view for a (transmission) resonator wherein the conductive coupling arms are spiral shape and rotate one around the other.

FIGS. 31, 32 depict a transmission resonator in which a loop conductive coupling arm 105 coupled to a transmission resonator 92. The signal is coupled out from the bottom side of cylindrical structure 92 a via a loop conductive arm 106 out of the structure through the inter-digital capacitor 113 to the output microstrip line.

Figure 33:
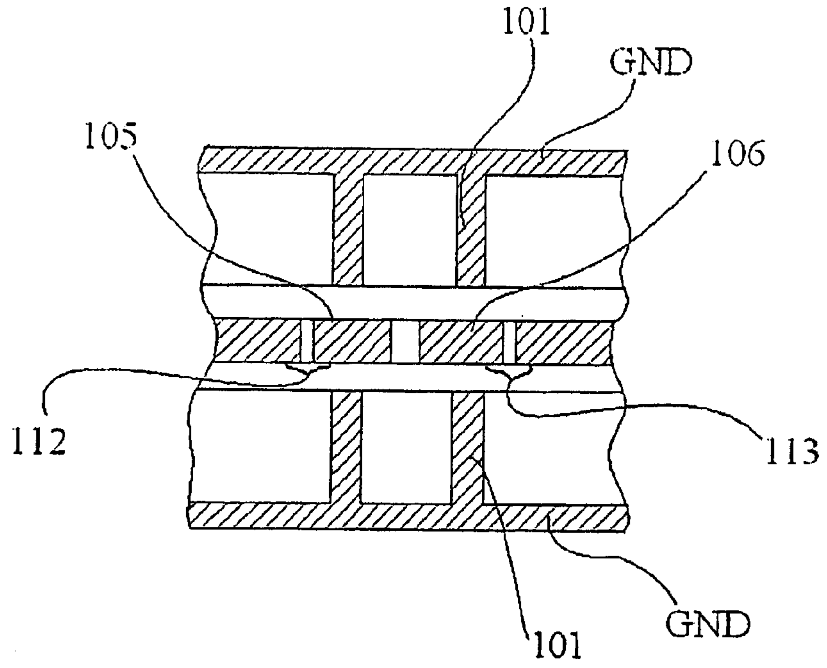
FIG. 33 depicts a vertical cross section for a resonator wherein the signal is coupled from a stripline located in the mid-height of cylindrical structure. The signal is coupled via an inter digital capacitor to a shielded reflection resonator structure coupled via a straight conductive coupling arm which couples the signal to a cylindrical resonator. The signal is coupled out of from the opposite side of cylindrical structure via a straight conductive arm out of the structure via another inter digital capacitor to the output port stripline.
Figure 34:
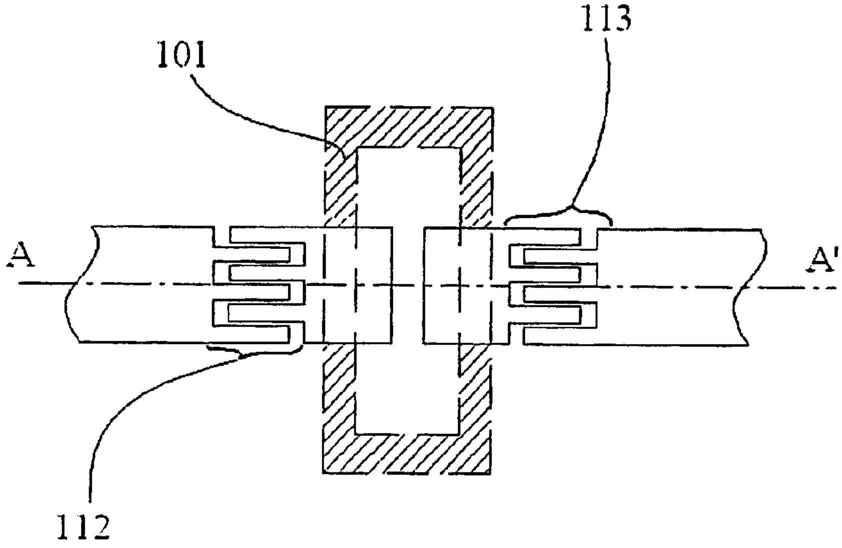
FIG. 34 depicts a horizontal cross sectional view for the resonator as depicted in FIG. 33 wherein the cross section plane is located at the top of coupling arms and a rectangular cross section for the cylindrical structure is chosen.

FIGS. 33, 34 depict signal coupled from a stripline via an inter-digital capacitor to a shielded reflection resonator structure (with a rectangular cross section) coupled via a straight conductive coupling arm 105 coupled a transmission resonator 90. The signal is coupled out of from the opposite side of cylindrical structure 92 via a straight conductive arm 106 out of the structure via another inter-digital capacitor 113 to the output port strip line.

Figure 35:
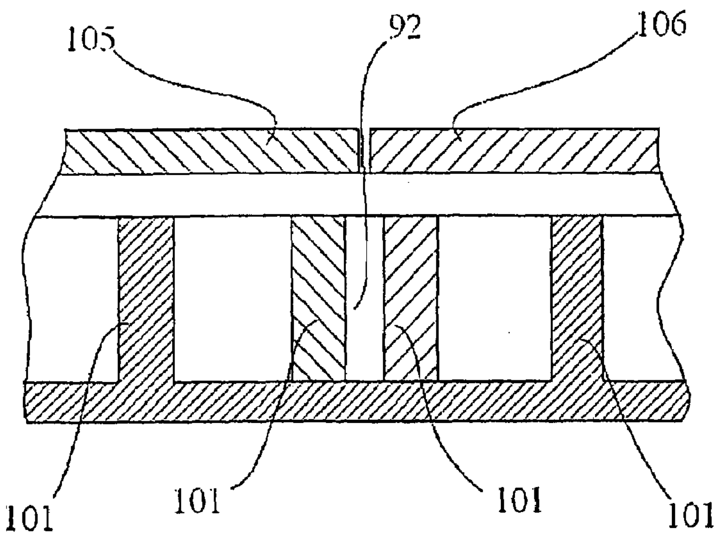
FIG. 35 depicts a vertical cross section for a resonator wherein signal coupled in an out from a microstrip line to ridged cylindrical structure via a straight conductive arms located above the ridges.
Figure 36:
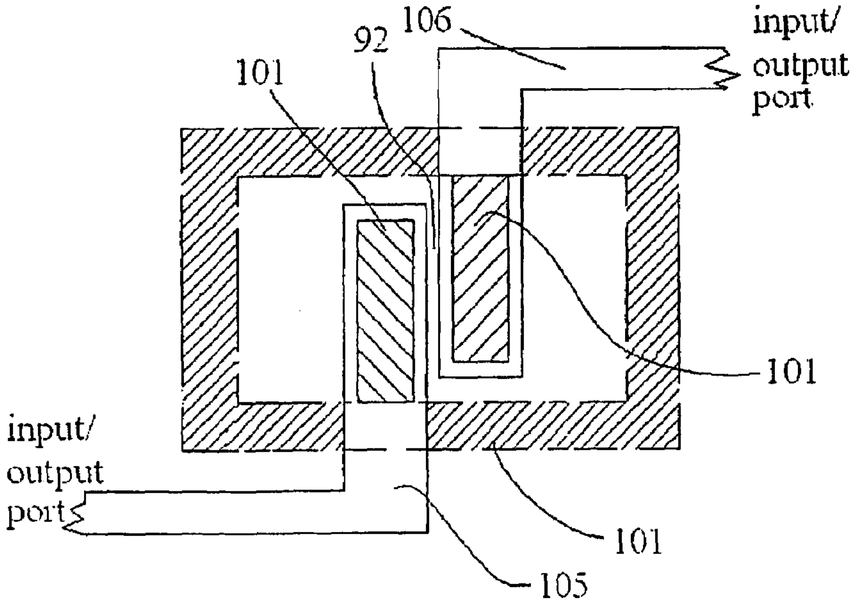
FIG. 36 depicts the top view for the structure as depicted in FIG. 35.

FIGS. 35, 36 depict signal coupled from a micro to ridged cylindrical structure 92 via a straight conductive arms 106/105. the arms are located on top of the ridges in order to maximize the coupling.

Figure 37:
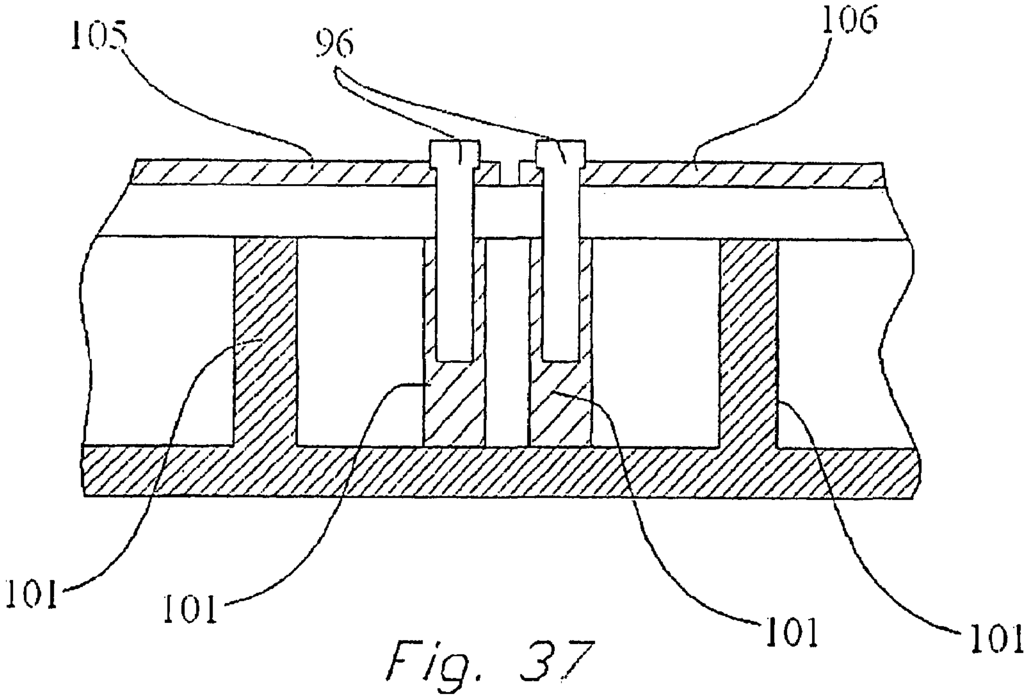
FIG. 37 depicts a vertical cross section for a resonator wherein signal is coupled from a microstripline to ridged cylindrical structure via straight conductive arms that are attached to the ridges by conductive pins or screws.
Figure 38:
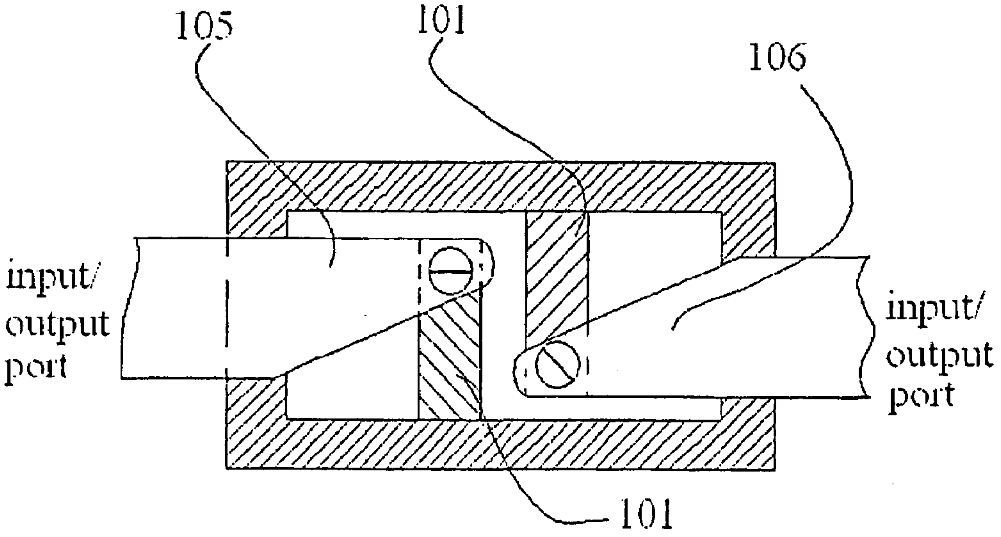
FIG. 38 depicts the top view for the structure as depicted in FIG. 37.

FIGS. 37, 38 depict signal coupled from a micro to ridged cylindrical structure 98 a via a straight conductive arms 106/105. the arms are attached to the ridges by conductive pins.

Figure 39A:
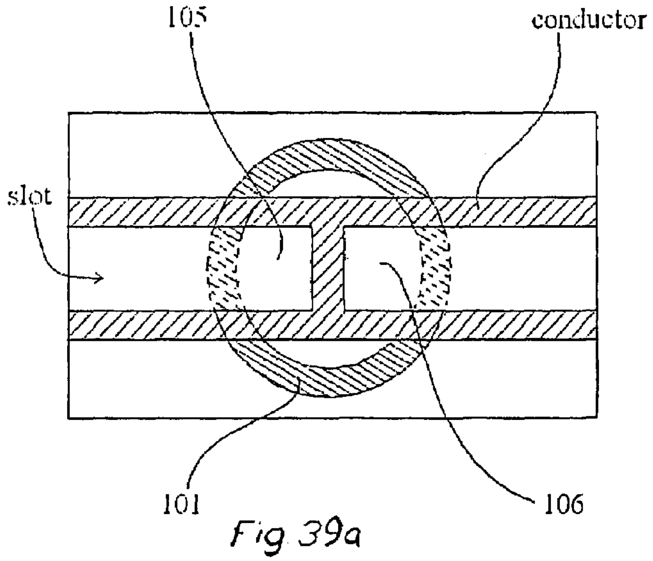
FIG. 39*a* depicts the top view for an embodiment of the present invention using a slot lines.
Figure 39B:
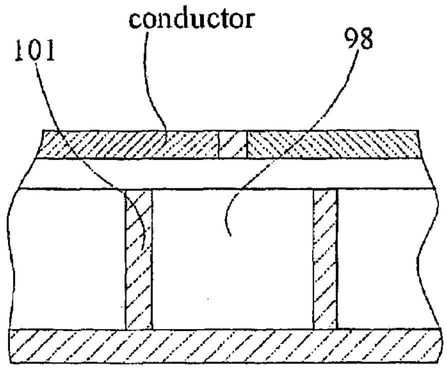
FIG. 39*b* a vertical cross-sectional view for the resonator as depicted in FIG. 39*a* wherein the cross sectional plane is chosen to be perpendicular to the slot lines.
Figure 39C:
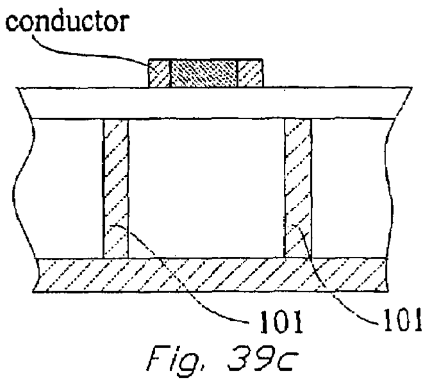

FIG. 39 depicts an embodiment of the invention using a slot lines as were describe in FIG. 1-*b*. Slot lines are commonly used in MMIC's as well as the other types of transmission lines as described in FIGS. 1*a* through 1*j*. Similarly, all types of the abovementioned transmission lines are usable to couple in conjunction with the cylindrical structure 92 resonator as mentioned above.

Figure 40:
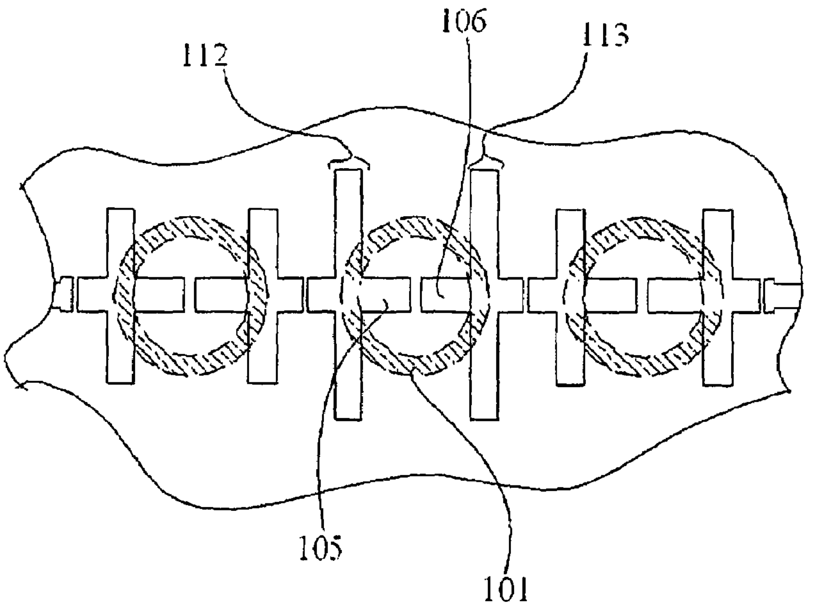
FIG. 40 depicts the top view for an implementation of a multi-resonator filter using the invention reflection type of the invented resonator.

FIG. 40 depicts implementation of a filter using the invention reflection type of the invention resonator.

Figure 41:
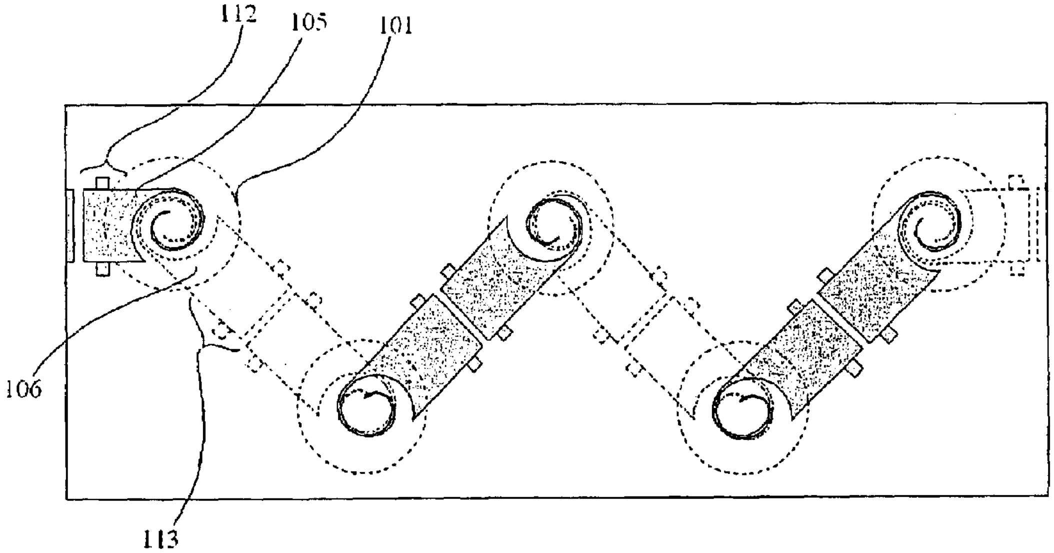
FIG. 41 depicts the top view for an implementation of a multi-resonator filter using the invention transmission type of the invented resonator wherein the coupling spiral coupling arms and the respective locations of the resonators have a zigzag shape.
Figure 41A:
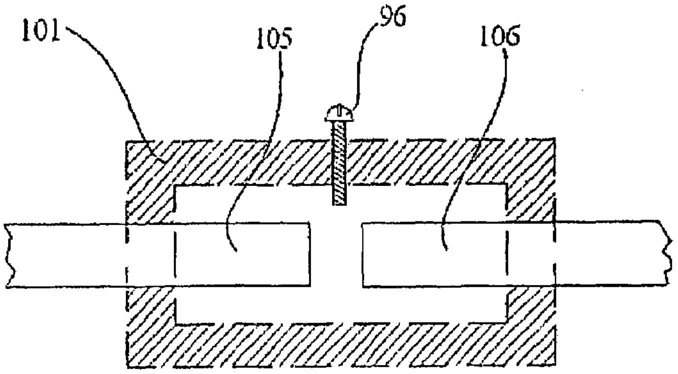
FIG. 41*a* depicts the view for an implementation of a resonator wherein tuning screws are utilized.

FIG. 41 depicts implementation of a resonator using the invention transmission type of the invention resonator where tuning is accomplished by cutting out tuning pads.

For the purpose of illustration the operation of the resonant structure is described hereinafter Resonators serve as the basic components for many types of filters. In general they are composed of various inductive and capacitive elements. The capacitive elements are constituted by any two conductors separated by dielectric material or hollow space in between or portions of waveguides or transmission lines. Inductive elements are constituted by conductors, waveguides, and portions of transmission lines. However in distributed elements, a capacitive element at certain frequency can behave as an inductive element at another frequency and vice versa. Lumped elements are small in comparison to the wavelength and their behavior from inductive to capacitive behavior does not occur from frequency change in the range of interest.

Depending on dimensions and the relevant frequencies plated through holes could be considered as lumped inductive elements, evanescent mode waveguides or propagating waveguides. In all the three mentioned cases the plated through holes provide inductive reactance needed for resonance condition. Bandpass filters are the most common type of filters used in communications. Usually in order to obtain rejection outside of the pass band of the filter, multi-section filters are required. Each section is a resonator which an LC equivalent circuit is obtainable. In this invention the cylindrical structure mainly provides the inductive portion of the resonance and the capacitive components are constructed via the any two conductors separated via dielectrics or hollow space between them.

Figure 51:
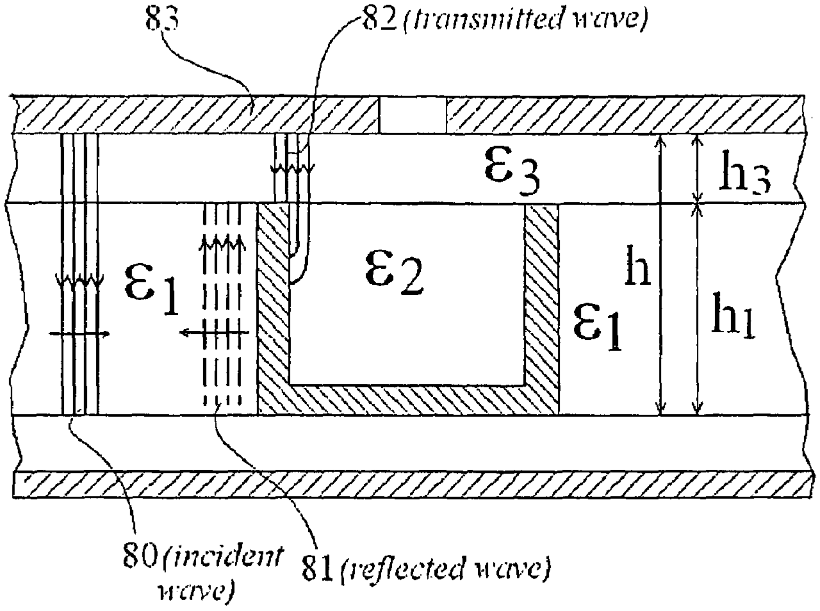
FIG. 51 depicts a vertical cross sectional view for resonator with the electric field lines traveling towards the resonator and substantial portion of the transmitted signal is reflected from the walls of the cylinder and a substantially small portion of the signal transmitted signal is coupled to the cylindrical structure.

FIG. 51 depicts a resonator with the electric field lines traveling towards the resonator and partially reflecting from the walls of the cylinder. The reflection from conductor is resulted from applying the boundary conditions at the cylinder conductive wall. Since the total tangential component of electric field vanishes on a conductive surface, an opposite electric traveling in the reverse direction, i.e., away from the cylinder must exist to satisfy the boundary conditions. In FIG. 51, the solid lines 80 represent the vertical component of electric field traveling towards the cylinder wall and the dashed lines 81 represent the electric field traveling away the cylinder wall. And lines 82 are coupled to the resonator. As noticeable in the figure the energy of reflected wave field traveling in dielectric layer designated with a dielectric constant of $\in_1$ could be significant. However, in dielectric layer designated with a dielectric constant of $\in_3$ the conductive wall is not present and such reflections as severe of layer $\in_3$ does not occur and some of the energy of the wave is coupled to the cylinder.

However, as the reflected wave in layer $\in_1$ travels back the boundary conditions between the two dielectric layers $\in_1$ and $\in_3$, i.e., continuity of normal component of displacement vector D, i.e, $D_{1n}=D_{3n}$ predicts the presence of reflected wave in the $\in_3$ layer due to reflections in layer $\in_1$ constituting a reflected voltage $V^-$ traveling away from the cylinder. At any arbitrary point on the transmission line 83 the ratio of $\Gamma=V^-/V^+$ corresponds to the presence of equivalent reactive element (inductive or capacitive) at the boundary of the cylinder.

In order to decrease the reflection losses as a result of the above-mentioned phenomena, one of the following techniques is utilized according to another aspect of this invention.

a. Introduction of a matching elements that cancels the effect of the above mentioned reactance, i.e., introducing of another reactive element with a conjugate match which would further reduce the bandwidth of the resonator which might not be desirable in most situations in addition to requiring more space.

b. A rough analysis of energy inside various layers of a composite microstrip line substrate indicates that the dielectric layers with higher dielectric constant carry higher energy density. This analysis does not include the spread of the fringing field and other secondary effect but it provides a guideline for selection of dielectric layers for minimizing the energy of reflected signals by the metallic wall of the structure. The energy density inside a dielectric material is proportional to $\in.|E|^2$ the energy of the portion of the wave traveling inside $\in_1$ layer can be minimized by selecting a significantly higher dielectric constant for $\in_3$ and than $\in_1$ ($\in_3 >> \in_1$). Since the boundary conditions predict that normal component to the boundary of electric flux density D is continuous at the boundary (in the absence of electric charges at the boundary)

$$D_{1n}=D_{3n}$$

$$\in_1 \cdot E_1 = \in_3 \cdot E_3$$

$$E_3/E_1 = \in_1/\in_3 << 1$$

or:

$$E_{3n} << E_{1n}$$

Figure 52:
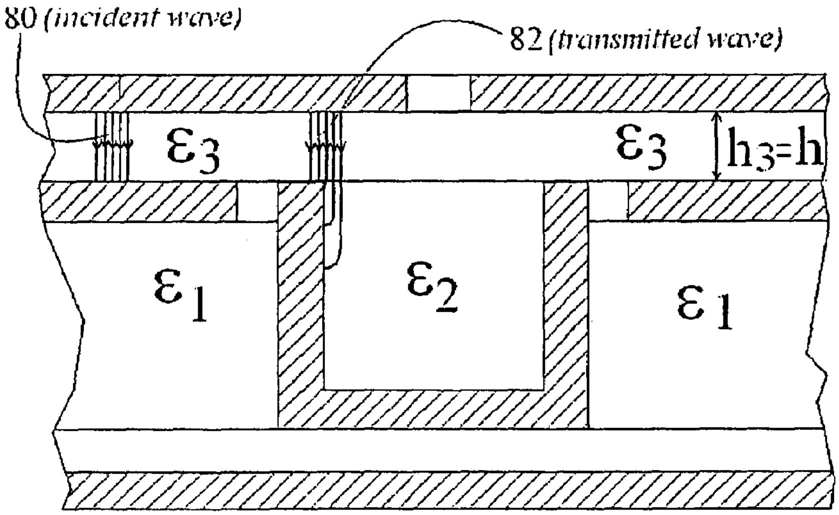
FIG. 52 depicts a vertical cross sectional view for resonator with the electric field lines traveling towards the resonator and substantially small portion of the transmitted signal is reflected from the walls of the cylinder and a substantial portion of the signal transmitted signal is coupled to the cylindrical structure.
Figure 53:
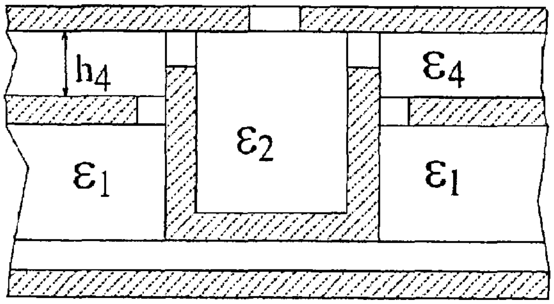
FIG. 53 depicts a vertical cross sectional view for resonator wherein, the top dielectric layer has a moderate height.
Figure 54A:
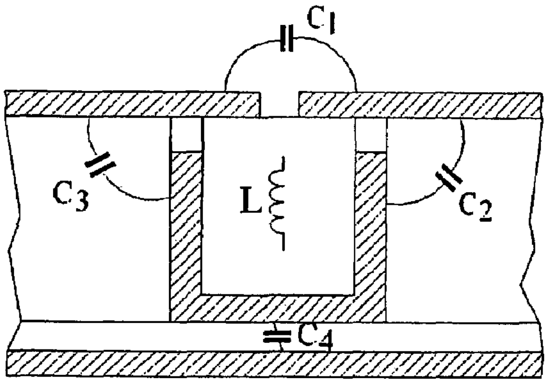
FIG. 54*a* depicts the vertical cross sectional view of a resonator according to the present invention wherein the corresponding equivalent circuit components of the resonating structure is super imposed on the FIGURE.
Figure 54B:
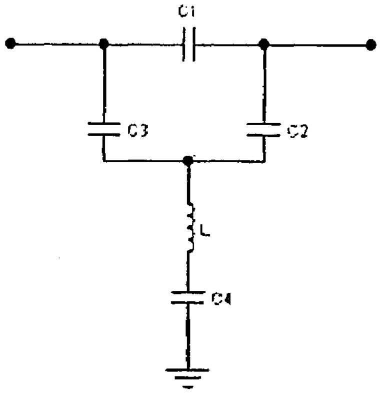
FIG. 54*b* depicts a schematic variation of a circuit according to one embodiment.
Figure 54C:
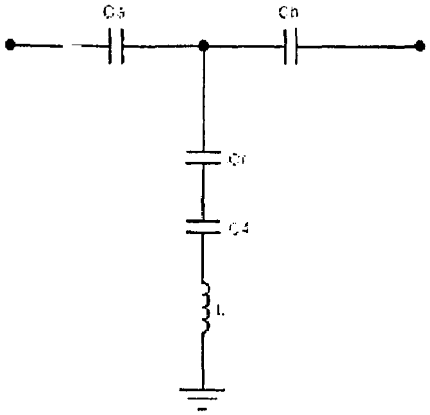
FIG. 54*c* depicts the schematics for a variation of the equivalent circuit depicted FIG. 54*a* using a PI to T circuit transformation.
Figure 54D:
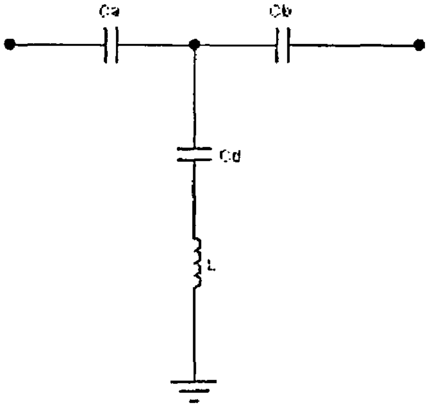
FIG. 54*d* depicts a simplified equivalent circuit of the schematics circuit depicted in FIG. 54*c*.

Therefore, without consideration of secondary effects such as the non-uniform and fringing fields in the two dielectric layers, this analysis indicates that if the selection of the dielectric constants $\in_1$ and $\in_3$ is in such a way that the energy in layer $\in_3$ is higher than $\in_3$:

$$\in_1 \cdot h_1 \cdot w \cdot |E_1|^2 << \in_3 \cdot h_3 \cdot w \cdot |E_3|^2$$

to a good extend even $h_1 > h_3$ the reflection of the wave by the cylindrical wall would not be of concern. This method has its limitations. The manufacturing process of such a high dielectric material (e.g., $\in_3 > 30$) and adding to a regular circuit board is costly. Similarly, in the case of implementation of the resonator in semiconductor integrated circuits such high dielectric constants substrates are not sensible.

c. By utilizing an intermediate conductive layer a micro strip line is established between this intermediate layer and the top conductor in the layer designated as layer $\in_3$. Thereby, the energy is mainly present in the layer $\in_3$ and the presence of energy in the dielectric layer designated as $\in_1$ is eliminated and as a result the problems associated with the reflections from the cylinders conductive wall does not exist anymore. FIG. 52 depicts this configuration. A simple micro-strip transmission line is established between the top conductor and an intermediate conductor layer which serves as the ground as depicted in the cross sectional cuts of FIG. 52. In this method the problem arising from the reflections resulting from the electric field being shorted by the conductive boundary of the resonator is eliminated. Also, there is no need for other reactive matching elements for providing the canceling effects for the reflected waves. Therefore, wider bandwidth can be obtained from each resonator. Furthermore, since the layer $\in_3$ has shorter height the width for capacitive elements are narrower than the case where the capacitive elements were established by the combination of both layers $\in_1$ and $\in_3$. As a result, the expense of high dielectric constant material is avoided and any ordinary circuit board material can be used for layer $\in_3$. In addition, size reduction is achieved in this type implementation, i.e., the required real estate reduced as the required capacitance can be obtained from using a smaller area due to height reduction. Since h is significantly smaller in FIG. 52 than FIG. 51, the capacitance area A is reduced by the accordingly in order to obtain the same capacitance $C=\in A/h$. if similar dielectric material is used.

d. A variation of the invention as in FIG. 53, overcome the problems resulting from resulting from very thin dielectric layer height h3. When the height of the dielectric layer h3 is very small in some manufacturing processes tolerances of height becomes excessive and the resultant capacitors mad using that layer are inconsistent. In addition, when the height h3 the characteristic impedance of transmission lines with practical line widths tend to be very low and the range of required the characteristic impedances are often not be attainable. FIG. 53 utilizes a dielectric layer $\in_4$ with a moderate height h4. The height h4 of this layer is not as high as layers h1+h3 which causes significant reflection problems.

In relation to dimensions of the resonators versus the operating frequency, there are three different modes of operations: lumped, evanescent, and propagating mode of operation also a combination of them i.e., the dimension in one direction is small in comparison to a quarter wavelength but not small in another direction. The lumped element type provides the most space efficient resonator wherever appropriate.

1. Lumped. Resonators

For frequency ranges which the dimensions of the structure are much smaller than a quarter wavelength, lumped element equivalent capacitances and inductances are the simplest and appropriate.

FIG. 54-*a* depicts the longitudinal cross section of a possible implementation of such resonator. The equivalent components are drawn on the figure and the consequential equivalent circuits are depicted in FIGS. 54-*b*, 54-*c*, 54-*d*.

The values for $C_1$ can be calculated with a good approximation with electrostatic analysis using equations provided for calculation of capacitance of gaps in micro-strip lines which is by provided references cited below these equations do not contain the effects of the wall of the cylinder but values are provide a sufficiently close for first degree approximation of C1:

Ba=−2*h*log(cosh(pi*s/2/h))/lambda

Bb=h*log(coth(pi*s/2/h))/lambda

BA=(1+Ba*cot(beta*s/2))/(cot(beta*s/2)−Ba)

C1=((1+(2*Bb+Ba)*cot(beta*s/2))/(cot(beta*s/2)−2*Bb−Ba)−BA)/(2*pi*f*Z0)

Reference is made here to Handbook of Microwave and optical Components, Volume 1, Edited by Kai Chang, 1989, the entirety of which is incorporated herein by reference. Reference is also made to Computer Aided Design of Microwave circuits, K. C. Gupta, Ramesh Garg, Rakesh Chadha, 1981, the entirety of which is incorporated herein by reference. Reference is also made to Minoru Maeda, “An Analysis of Gap in Microstrip Transmission Lines”, IEEE-TRANSACTIONS ON MICROWAVE THEORY AND TECHNIQUES., VOL. MTT 20, NO.26 June 1972, the entirety of which is incorporated herein by reference.

Figure 58:
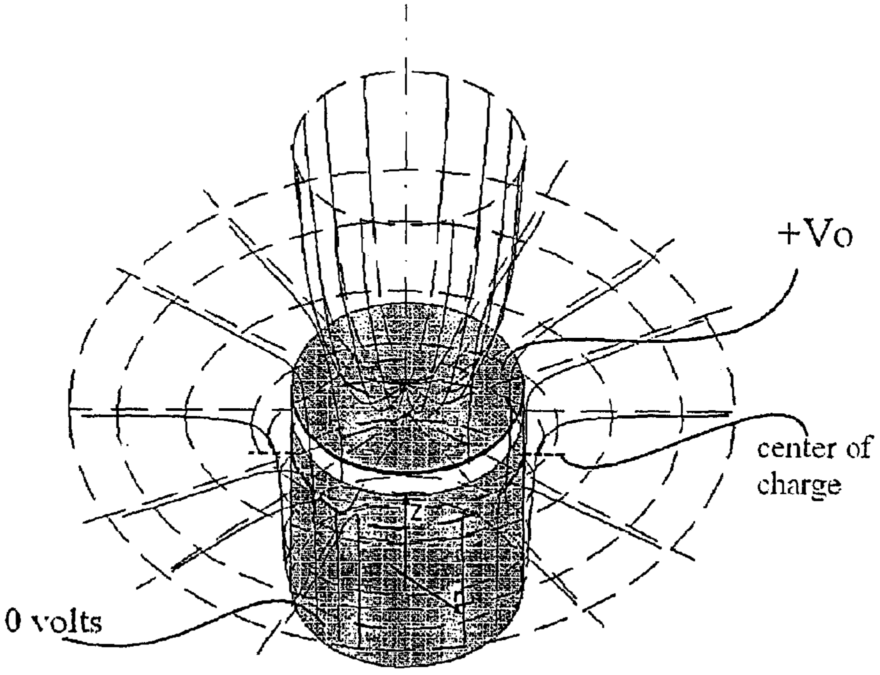
FIG. 58 depicts the three-dimensional charge distribution of the top plate of the cylindrical structure described in FIG. 57*a*.
Figure 58A:
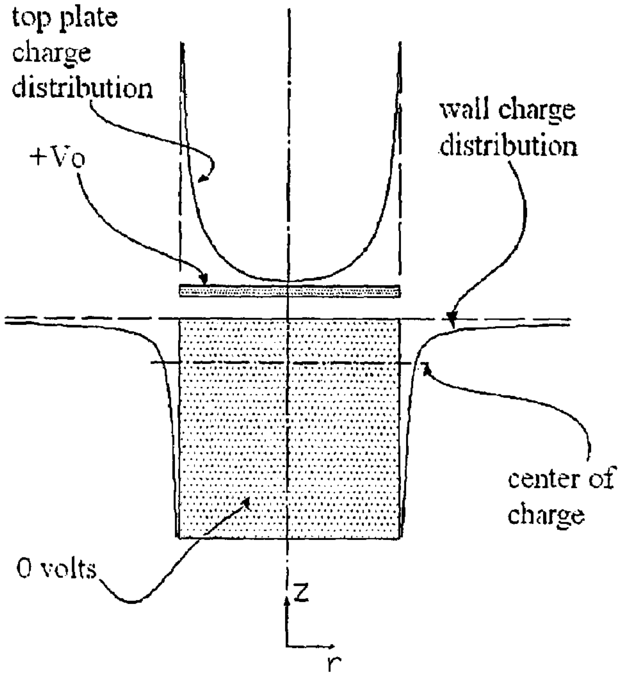
FIG. 58*a* depicts a clarification of FIGS. 57*b* and 57*d* depiction of the cylindrical structure described in FIG. 57*a* and superimposing the charge density distributions on the outside wall and the top plate.

For calculation of $C_2$ and $C_3$ the following methodology can be is utilized. First the capacitance of a cylindrical structure with bottom side walls are attached together at zero potential and the top surface is at a different potential is calculated. FIGS. 58 and 58*a* depicts a cylindrical structure with bottom side and side walls are attached together at zero potential. The top surface is at potential V0. The capacitance C which is the total capacitance between the top surfaces inside of the rest of the structure can be calculated by solving Possion's equation $\nabla^2 V=0$ for a conductive cylinder as of FIG. 102 obtaining a series solution for V:

$$V(r,z)=\sum_{n=odd} 4*V0.*\sinh(n*pi*z/d).*\sin(n*pi*r/d+n*pi/2)./(n*pi.*\sinh(n*pi*h/d))$$

Such analysis leads to calculation of the potential distribution in the space inside and on the surfaces of the cylinder. By obtaining $E=-\nabla V$ in the radial direction at the side walls and the normal component of the electric field to the walls is obtained. Similarly, by applying $E=-\nabla V$ in the z-direction at the top and bottom surfaces the normal component of the electric field to the walls is obtained. Charge density on these surfaces can be calculated by:

$$\rho_s=|D_n|=\epsilon_0\cdot\epsilon_r\cdot|E_n|$$

The total electric charge Q located inside the surface above the cylinder located on the top plate is calculated numerically by taking surface integral over the top plate. The static capacitance is obtained from $C_{layer\text{-}2}=V_0/Q$ which is the capacitance of the capacitor formed by the circular area of the top plate and the walls and the bottom plate of the structure. If the top plate is extended outside of the cylinder a similar concept is used to obtain the capacitance between the side wall area of the cylinder and the surfaces of the top plate located outside cylinder. If the dielectric constants are the same, i.e., $\epsilon_2=\epsilon_1$, the capacitance for the outside area of the plate would approximately be the same as the capacitance for the inside surface, i.e., $C_{layer\text{-}1}\cong C_{layer\text{-}2}$. this is due to the fact that the charge distributions on the top plate is mostly concentrated in the area above the cylinder side wall. However since in general $\epsilon_3\neq\epsilon_1$, the capacitance for the outside capacitance is obtained by applying the ratio of the dielectric constants as the correction factor i.e., $C_{layer\text{-}1}\cong(\epsilon_1/\epsilon_2)$. $C_{layer\text{-}2}$ and $C_{Total}=C_{layer\text{-}1}+C_{layer\text{-}2}$.

In FIG. 57-*b* the center of the charge distribution on the side wall is marked as $h_{cap\text{-}eff}$ which is obtained by finding the center of the charge on the side wall or more accurately by integrating the over the inverse distance multiplied by the charge distribution on the cylinder wall and finding the inverse. FIG. 58 depicts a cylinder with a circle drawn on the cylinder wall corresponding to the center of the charge. This ring represents the effective location of the impressed signal by the top plates on the side wall.

The equivalent area of this capacitor is given by:

$$A_{eff\text{-}i}=C_{layer\text{-}i}\cdot h_{eff\text{-}cap\text{-}i}/(\epsilon_1\cdot\epsilon_0)$$

which corresponds to the area of an annular plate under the relevant portion of the top plate separated by a distance of distance of $h_{eff\text{-}cap\text{-}i}$ from the top plate for i=1, 2. The following formulation is valid for very small $h_3$, the height of thin thickness of dielectric layer $\epsilon_3$. To calculate the effects of dielectric layer $\epsilon_3$ on the capacitance is performed by including the effects of a series capacitor with area of $A_{eff}$ and height of the layer, $h_3$:

Where:

$$C_{layer\text{-}3\text{-}i}=\epsilon_3 A_{eff\text{-}i}/h_3$$

Therefore:

$$C_{total}=C_{layer\text{-}3\text{-}1}+C_{layer\text{-}3\text{-}2}$$

$C_{total}$ represents the value capacitance of a solid plate separated covering above the structure. However, for the bandpass case when there is a gap in the top plate, the capacitances $C_2$ and $C_3$ which correspond to the capacitance between each arm and the cylinder as described in are calculated by calculating the fraction of $C_{total}$ proportional to the area which each arms covers. When the arms are covering the area above the cylinder and the gap is small:

$$C_2=C_3\cong C_{total}/2$$

The equation for inductance of via hole is given in the reference Modeling via hole grounds in microstrip *Golfarb, M. E.; Pucel, R. A.* IEEE Microwave and Guided Wave Letters [see also IEEE Microwave and Wireless Components Letters], Volume: 1 Issue: 6, Jun. 1991, Page(s): 135-137, the entirety of which is incorporated herein by reference:

$$L=u0*(h*(\ln((h+\mathrm{sqrt}(a^{\wedge}2+h^{\wedge}2)/a))+1.5*(a-\mathrm{sqrt}(a^{\wedge}2+h^{\wedge}2))))/2/pi$$

This equation is corrected empirically from the previous derivations. It is stated in the Goldfarb reference that the above equation follows very closely to greater extent with the actual measurements as well as electromagnetic simulations than the equations provided by earlier works. In the case of the structure under discussion in this invention, when the effective height $h_{eff\text{-}ind}$ instead of the actual height h is used is in the above equation a more accurate assessment of the inductance of the cylinder is expected.

Figure 55:
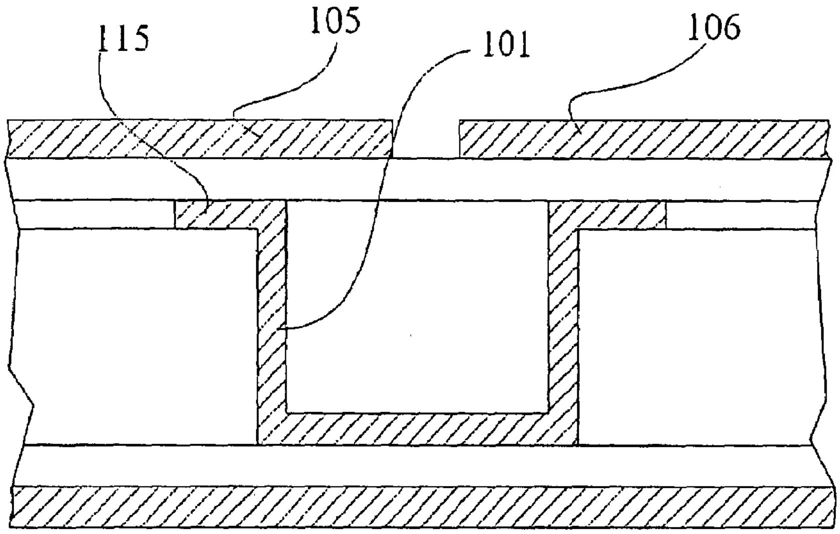
FIG. 55 depicts a vertical cross-sectional view for a variation of the resonator structure wherein, an annular ring is added to the top end of cylindrical wall in order to increase the interaction between the cylinder and the coupling arms.

FIG. 55 depicts a variation of the resonator structure. An annular ring 115 is added to the top end of cylindrical wall in order to increase the interaction between the cylinder and the coupling arms. Addition of this ring increases the capacitances $C_2$ and $C_3$ and more coupling to the resonator is obtained. As a result of adding the annular ring the location of the hypothetical ring corresponding to the center of the charge as of FIG. 54 is moved up closer to the coupling arms and the effective height of the cylinder $h_{eff}$ is increased. If the ratio of the width to the height of this capacitor is large the effect of fringing fields can be neglected and the capacitance between the arms and the cylinder can be simply calculated from simple capacitor equation: $C=\epsilon_3\cdot\epsilon_0\cdot A/h_3$, where A is the area of the portion of the coupling arm located above the annular ring.

Figure 56:
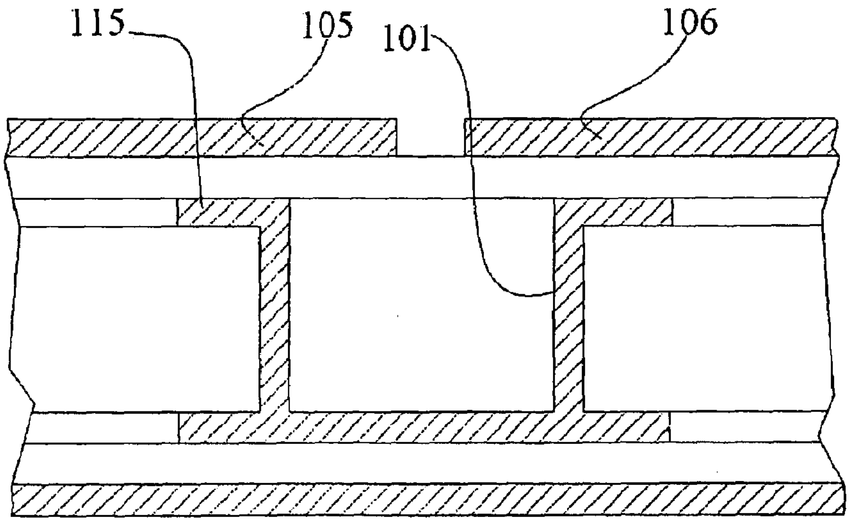
FIG. 56 depicts a vertical cross-sectional view for a variation of the resonator structure of FIG. 55 wherein, an additional annular ring is added to the bottom end of cylindrical wall in order to increase the interaction between the cylinder and the ground plane.
Figure 57A:
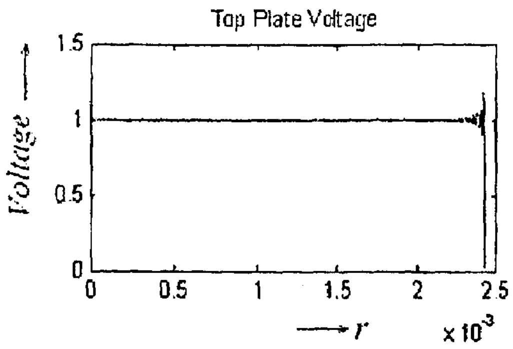
FIG. 57*a* depicts the relationship between voltage versus radius on the top plate using computer simulation for a hollow cylindrical structure in which the top cover is separated from the rest of the structure by a small gap and a voltage is imposed on between the top plate and the rest of the structure.
Figure 57B:
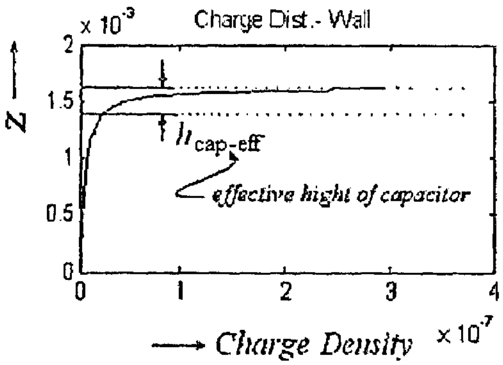
FIG. 57*b* depicts the charge distribution density on the outside wall of the cylindrical structure described in FIG. 57*a*.
Figure 57C:
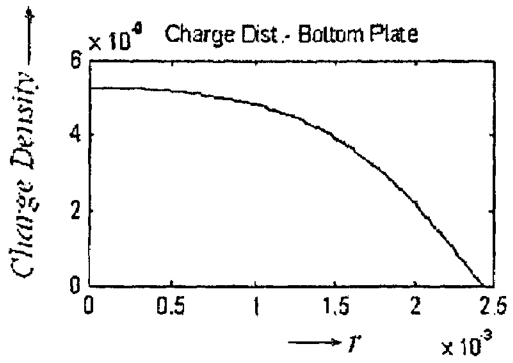
FIG. 57*c* depicts the charge distribution density on the bottom plate of the cylindrical structure described in FIG. 57*a*.
Figure 57D:
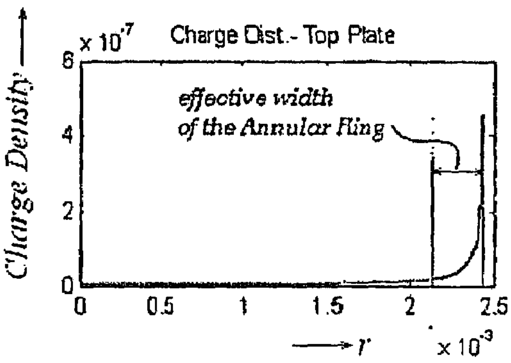
FIG. 57*d* depicts the charge distribution density on the top plate of the cylindrical structure described in FIG. 57*a*.

Similarly in order to obtain more capacitance between the cylinder bottom plate and the ground, the metalization in the bottom can be extended as in FIG. 56

Often, the need to size reduction or in effect lowering the frequency requires larger capacitors for the gap capacitance, i.e. the capacitance between the arms $C_1$. This can be accomplished by implementing an inter-digital capacitor or a slanted cut. The equations for calculation of capacitance for interdigital and overly capacitor is provided in various texts, e.g., the reference K. C. Gupta, Ramesh Garg, Rakesh Chadha, "COMPUTER AIDED DESIGN OF MICROWAVE CIRCUITS", "1981, pages 213-219, the entirety of which is incorporated herein by reference. FIGS. 25 depicts coupling via two spiral conductors "inter-spiral coupling" which offers more coupling between the two arms and therefore a higher value for $C_1$.

Accuracy

A more accurate calculation for the component values or any portion or the entire structure can be deviced by using commercially available electromagnetic analysis software packages such as SONNET, HFSS or similar packages available for three-dimensional structures.

Filter Design Procedure

There are various approaches to for a filter or other RF/microwave circuit component design using the resonators discussed in this invention. The major important parameters for filter synthesis are bandwidth and center frequency at certain impedance level in simple resonators. The reference cited below provides design procedures based on lumped element equivalent resonator circuits which is common practice to those skilled in the art. Reference is made herein to Reference Data for Engineers: Radio, Electronics, Computer, and Communications, seventh edition, Edward C. Jordan, Editor in chief 1986, the entirety of which is incorporated herein by reference. See also the Chang reference. Reference is also made to Arthur B. Williams, Fred J. Taylor, "Electronic Filter Design Handbook: LC, Active and Digital Filters", Second Edition, 1988.

1) For each resonator needed in a filter has a known component values or set of S-parameters in the band of interest. The two port S-parameters of the desired resonator can be obtained from the lumped element synthesized circuit by using any circuit simulator program. Also, the two port S-parameters of the desired resonator can be obtained using an electromagnetic analysis software packages. Using optimization techniques an equivalent LCR similar to the topologies given in FIG. 54*d* which closely follows two port S-parameters obtained from electromagnetic program or actual measurements in the band of interest can obtained. An equivalent circuit with estimated values is used to a circuit simulation program and an optimizer (e.g., Microwave Office, Super Compact, Touchstone) optimizes the circuit component values in the equivalent until a close match of S-parameters in the band of interest is obtained. The two important parameters in a simple resonator is bandwidth and center frequency at the impedance level of interest. Often the practical resonators provide the bandwidth and center frequency at a different impedance level. Physical dimensions are changed e.g., width of annular disc for changing C2 and C3 or change of the gap type or size for changing C1 until the center frequency and the bandwidth of the resonator are obtained. Filter impedance is adjusted to the proper impedance (often 50 Ohms) by introducing a combination of shunt and series reactances at the input and output or any type of impedance inverter the required level is obtained which is trivial for the engineers skilled in the art.

2) In a process of trial and error a family of curves can be obtained for center frequency and bandwidth for different dimensions, using standard thickness and standard relative dielectric constants of different layer. Equivalent circuits can be obtained from the predicted bandwidth and center frequencies. In order to obtain a resonator operating at a lower frequency metalization can be added to as the shunt capacitances to the resonator. Alternatively, the family of the curves can be plotted for the relationship between the physical dimensions and dielectric constant versus the elements of equivalent circuits. The equivalent circuit concept serves as a preliminary synthesis tool.

Using standard techniques for synthesis of lumped element LC circuit provided in the references cited below. In order to realize actual design from the lumped element LC network and using the family of the curves to obtain the physical dimensions for the desired filter. See the Chang reference. See the Williams reference.

2. Evanescent. Mode Resonance

In guide structures, evanescent mode of operation corresponds to operation below the cutoff frequency of the guide. The advantage is reduction of the size but filled with dielectric material even provides further size reduction:

FIGS. 3, 5-39, 53, 55, and 56 depict a resonator based on evanescent mode of operation.

$$\beta=2\pi/\lambda=2\pi(\mu\epsilon)^{1/2}f$$

$\lambda$ is wavelength in infinite media, $$\beta_{mn}=\beta\cdot\sqrt{1-[(f_c)_{eff}/f]^2}$$

$$(f_c)_{mn}=\sqrt{(m\cdot\pi/a)^2+(n\cdot\pi/b)^2}/(2\pi\cdot a\cdot\sqrt{\mu\epsilon})$$

$(f_c)_{mn}$ is the cutoff frequency for (m, n) mode.

At frequencies below cutoff, i.e., evanescent mode waveguide $\beta_{mn}$ becomes imaginary given by:

$$\beta_{mn}=-j\beta\cdot\sqrt{[(f_c)_{eff}/f]^2-1}$$

Figure 60A:
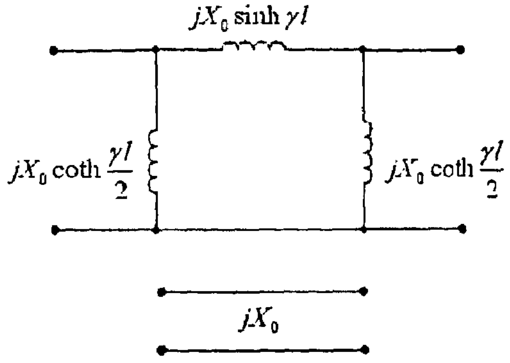
FIG. 60*a* depicts the PI equivalent circuit for a waveguide below cutoff.
Figure 60B:
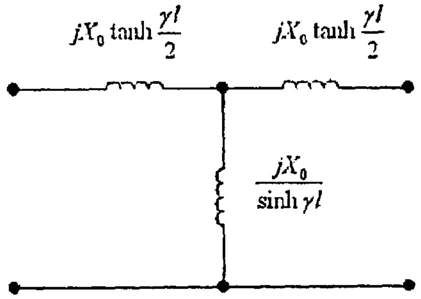
FIG. 60*b* depicts the T equivalent circuit for a waveguide below cutoff.
Figure 61A:
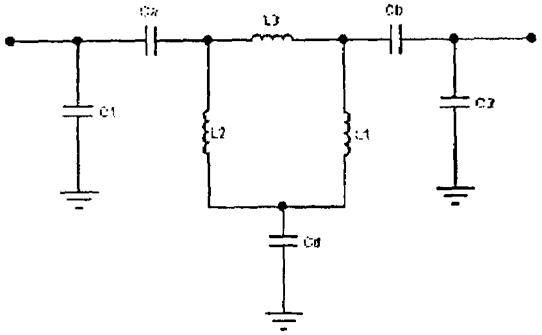
FIG. 61*a* depicts the equivalent circuit for a resonator which includes a cylindrical structure which includes a waveguide below cutoff and coupling arms with capacitive coupling.
Figure 61B:
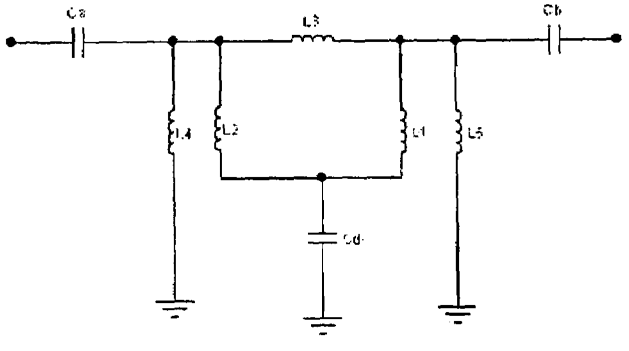
FIG. 61*b* depicts the equivalent circuit for a resonator which includes a cylindrical structure which includes a waveguide below cutoff and coupling arms with inductive coupling.

A sections of waveguide (circular, rectangular or other types of cross section) operating below the cutoff frequency can be a utilized as the inductive portion of the resonator. FIG. 60 depicts the $\pi$ and T equivalent circuit for a waveguide below cutoff is provided in George F. Craven, "Waveguide below Cutoff: A New Type of Microwave integrated Circuit", The Microwave Journal, August 1970, the entirety of which is incorporated herein by reference. This equivalent circuit is simply derived from regular transmission line equations using imaginary characteristic impedance and propagation constant in the evanescent mode. In waveguides operating in evanescent mode, the coupling arms are in effect short antennas have capacitive impedance and further capacitances can be provided externally, e.g., external metalization on circuit board/substrate also are shunt capacitor reactances. FIGS. 61-*a* and 61-*b* depict the equivalent circuit for such resonators.

The techniques discussed in the above section for lumped element for finding an equivalent circuit, optimization and fine tuning the design applies for the evanescent mode.

Using Love's equivalence principle, R. E. Collin in chapter 7 of Robert E. Collin, Field Theory of Guided Waves, 1960, the entirety of which is incorporated herein by reference, derives the relationship between input impedance ($Z_{in}$=R+jX) of probe or loop coupled into a rectangular waveguide and the wave impedance ($Z_0$). Applying a more general formulation for probe excitation and changing the notation accordingly, impedance of the probe FIG. 33 is obtained by:

$$R=2(\mu/\epsilon)^{1/2}\sin^2(\beta_{mn}l)\tan^2(\beta d/2)/(ab\beta_{mn}\beta)$$

$$X_{mn}=(\mu/\epsilon)^{1/2}\sin(2\beta_{mn}l)\tan^2(\beta d/2)/(ab\beta_{mn}\beta)$$

Where R is the radiation resistance due to energy conversion from electrical to electromagnetic radiation propagating away from the guide or coupling out through a similar probe. $X_{mn}$ is reactance due to (probe) antennas evanescent fields. The above equations verifies that at frequencies below cut off the real part of impedance i.e., $Z_{in}$=R+jX is zero indicating no dissipative radiation at evanescent mode are present in wave guides. However in our structures as depicted in FIGS. 5 through 32 there radiations due to the fact that they radiators are open to semi-infinite space and not subject to restricting propagation below cut-off by the waveguide. Therefore, there is a degradation in the Q factor of the radiator and shielding provides restricts radiation from the coupling arms. FIG. 33 depicts a shielded evanescent mode resonator in which the above formulation may be applied. However, the if wide probes are to be used, the effect of their capacitances has to be taken into account.

The capacitive reactance portion of the resonator is obtained by taking into account the sum of all of the shunt capacitances, i.e., the capacitance formed on top of the resonator as well as the outside.

Accurate values for different geometries can be determined by a family of curves normalized to frequency obtained from electromagnetic simulation.

3. Propagating Mode Resonators

In the case of operating above the waveguide cut-off frequency the characteristic impedance is a real number given by equation 9-16-a in ref Advanced Engineering Electromagnetics , *Constantine A. Balanis*, November 1990, the entirety of which is incorporated herein by reference.

$$Z_{mn}=\sqrt{\mu/\epsilon}/\sqrt{1-(f_c/f)^2}$$

Each resonator works as a cylindrical wave guide with a short at the end. This waveguide could operates at frequencies below cut off (Evanescent mode). However, by introducing the reactive components, i.e., the capacitance produced by the micro-strip/strip line a resonance is established. As the selected relative dielectric constant of the material inside the cylinder is increased the resonance frequency gets closer to the cutoff frequency and as a result a wider resonance is obtainable or a smaller diameter would be required for the cylinder. The required diameter would be proportional to the inverse of square root of the relative dielectric constant.

Using Love's equivalence principle, R. E. Collin in chapter 7 of Robert E. Collin, Field Theory of Guided Waves, New York, 1960, the entirety of which is incorporated herein by reference derives the relationship between input impedance ($Z_{in}$=R+jX) of probe or loop coupled into a rectangular waveguide and the wave impedance ($Z_0$). Applying a more general formulation for probe excitation and changing the notation accordingly, impedance of the probe is obtained by:

$$R=2(\mu/\epsilon)^{1/2}\sin^2(\beta_{mn}l)\tan^2(\beta d/2)/(ab\beta_{mn}\beta)$$

$$X_{mn}=(\mu/\epsilon)^{1/2}\sin^2(\beta_{mn}l)\tan^2(\beta d/2)/(ab\beta_{mn}\beta)$$

Where R is the radiation resistance and $X_{mn}$ is reactance due to (probe) antennas evanescent fields, $\beta=2\pi/\lambda=2\pi(\mu\epsilon)^{1/2}f$ and λ is wavelength in infinite media, to avoid radiations from propagating resonators, structures similar to FIG. 33 has to be used.

The above applies to both rectangular and circular or arbitrary cross section such as ridged waveguides. A cavity enclosed by metal walls has an infinite number of natural frequencies at which resonance will occur. One of the most common types of cavity resonators is a length of transmission line (coaxial or waveguide) short circuited at both ends (The Jordan reference, page 30-20). Resonance occurs when $$2h=I(\lambda_g/2)$$

where,

I=an integer,

2h=Length of resonator, $\lambda_g$=guide wavelength in resonator=$\lambda/[\epsilon_r-(\lambda/\lambda c)^2]^{1/2}$ λ=free space wavelength, $\lambda_c$=guide cutoff wavelength $\epsilon_r$=relative dielectric constant of medium in the cavity.

Where $\lambda_c$ is given by:

$$\lambda_c=2/[(m/a)^2+(n/b)^2]^{1/2} \text{ for rectangular cavities,}$$

$$\lambda_c=2\pi a/\chi_{mn} \text{ for cylindrical cavities with circular cross section (TM modes),}$$

$$\lambda_c=2\pi a/\chi'_{mn} \text{ for cylindrical cavities with circular cross section (TE modes),}$$

where $\chi'_{mn}$ is the mth root of $J'_n(\chi)=0$ and $\chi_{mn}$ is the mth root of $J_n(\chi)=0$ (The Balanis reference pages 472 and 478 provides values for $\chi'_{mn}$ and $\chi_{mn}$), a is the guide radius.

Excitement of Modes

In every method of coupling (Micro-strip line, Strip line, slot line and co-planar wave guide) various wave guide modes are excited depending on the cutoff frequency of the wave guide evanescent or propagating modes are excited. However, if the frequency is below the cutoff frequency only evanescent modes are excited. The energy corresponding in each mode is determined by the physical parameters such as the dimensions and dielectric constants. Due to the complexity of such a problem, electromagnetic simulation using numerical methods (e.g., using commercially available programs such as HFSS™) could be used for an accurate analysis. However, good first order approximations are obtainable by tight coupling using the techniques of FIG. 12 and assuming the dominant mode of excitement. The dominant mode is determined by comparing at the electric field lines in the figures corresponding to the various modes as FIGS. 9-2 and 8-4 in the Balanis reference respectively for circular and rectangular cross section wave guides.

Since various modes are excited, the percentage of energy corresponding in each mode is determined by the physical parameters such as the dimensions and dielectric constants.

In the case of circular cross section also a combinations of modes are excited. For each mode there is a $\chi'_{mn}$ or $\chi_{mn}$ corresponding to a cutoff frequency of:

$$(f_c)_{mn}=\chi'_{mn}/2\pi a\sqrt{\mu\epsilon}$$

or $$(f_c)_{mn}=\chi_{mn}/2\pi a\sqrt{\mu\epsilon}$$

and depending on the percentages of energy of various modes an effective cutoff frequency $(f_c)_{eff}$ would simplify the problem into a simple waveguide problem, i.e., $(f_c)_{eff}$ would lead to a calculation of $(\beta_z)_{eff}$ from:

$$(\beta_z)_{eff}=\beta\cdot\sqrt{1-[(f_c)_{eff}/f]^2}$$

where β is 2π/λ and λ is wavelength in infinite media.

In the case of rectangular cross section also a combinations of modes are excited. For each mode there is a $\chi'_{mn}$ or $\chi_{mn}$ corresponding to a cutoff frequency of:

$$(f_c)_{mn}=\sqrt{(m\cdot\pi/a)^2+(n\cdot\pi/b)^2}/(2\pi\cdot a\cdot\sqrt{\mu\epsilon})$$

or $$(f_c)_{mn}=\chi_{mn}/2\pi a\sqrt{\mu\epsilon}$$

and depending on the percentages of energy of various modes an effective cutoff frequency $(f_c)_{eff}$ would simplify the problem into a simple waveguide problem, i.e., $(f_c)_{eff}$ would lead to a calculation of $(\beta_z)_{eff}$ from:

$$(\beta_z)_{eff}=\beta\cdot\sqrt{1-[(f_c)_{eff}/f]^2}$$

where β is 2π/λ and λ is wavelength in infinite media. Z is the direction of propagation which in both cases corresponds to the axis of the wave guide which is perpendicular to the cross section.

$$Z_t = Z_0(Z_L + jZ_0 \tan \beta_z l)/(Z_0 + jZ_L \tan \beta_z l)$$

Where:

l is the height of the structure, $Z_0$ is characteristic impedance which in this case corresponds to wave impedance given by:

$$Z_{eff} = \sqrt{\mu/\epsilon}/\sqrt{1-[(f_c)_{eff}/f]^2}$$

and $Z_L=0$ for shorted case and $Z_L=1/j\omega c$ for the case in which there is a dielectric layer between the bottom ground and the bottom of the structure and c is the capacitance between the bottom of the cylinder and the bottom ground calculated by c=∈A/h.

Other Types of Cross Section

Besides the ordinary wave guide cross sections, i.e., rectangular, circular and elliptical wave guides with more complex cross sections may be used to increase performance with regards to size reduction. Ridged wave guides accommodate signals in both propagating and evanescent modes of operations. Due to the extra surfaces that the ridges provide the cut-off frequency is lowered and would result a smaller cross section for similar performance in comparison to an ordinary shape such as rectangular or circular or elliptical cases. FIGS. 4F, 4G depict various cross section for ridged guides. Section 8.9 in the Balanis reference discusses the reduction of cutoff frequency as a result of addition of ridges to a rectangular waveguide. Approximate equation for cutoff frequency of ridged waveguide is given by equation (8-198):

$$f_c = \sqrt{(a \cdot b_0/a_0 \cdot b_0)}/[1/(1-a_0/a)]/(\pi \cdot a \cdot \sqrt{\mu\epsilon})$$

where a and b are waveguide dimensions and $a_0$ and $b_0$ are the ridges dimensions. The analysis of this equation as shown in the case of single ridge demonstrates a 5 to 1 decrease in cutoff frequency for $\cdot b_0/b=0.1$ and $a_0/a=0.2$ and 6t to 1 decrease in cutoff frequency for $\cdot b_0/b=0.$ and $a_0/a=0.28$. However the ridged waveguides are lossier than the ordinary guides and as a result resonators using ridges have lower Q factors. The cutoff frequencies for various standard single ridged waveguides are given in Table-4 page 30-10 of the Jordan reference.

Using a ridged waveguide lowers cutoff frequency due to increase of capacitance in the cross section, and as a result $\beta_z$ is increase and thereby a shorter length of waveguide is required in order to obtain the same electrical length of $\beta_z$.l.

Both rectangular and circular or arbitrary cross section such as ridged waveguides. A cavity enclosed by metal walls has an infinite number of natural frequencies at which resonance will occur. One of the most common types of cavity resonators is a length of transmission line (coaxial or waveguide) short circuited at both ends (The Jordan reference, page30-20). Resonance occurs when $$2h = I(\lambda_g/2)$$

where,

I=an integer,

2h=Length of resonator, $\lambda_g$=guide wavelength in resonator$=\lambda/[\epsilon_r-(\lambda/\lambda c)^2]^{1/2}$ λ=free space wavelength, $\lambda_c$=guide cutoff wavelength $\epsilon_r$=relative dielectric constant of medium in the cavity.

Where $\lambda_c$ is given by:

$$\lambda_c = 2/[(m/a)^2+(n/b)^2]^{1/2} \text{ for rectangular cavities,}$$

$$\lambda_c = 2\pi a/\chi_{mn} \text{ for cylindrical cavities with circular cross section (TM modes),}$$

$$\lambda_c = 2\pi a/\chi'_{mn} \text{ for cylindrical cavities with circular cross section (TE modes),}$$

where $\chi'_{mn}$ is the mth root of $J'_n(\chi)=0$ and $\chi_{mn}$ is the mth root of $J_n(\chi)=0$ (The Balanis reference pages 472 and 478 provides values for $\chi'_{mn}$ and $\chi_{mn}$), a is the guide radius.

Equivalent Circuit

Each resonator could be modeled as an LC equivalent circuit. The equivalent circuit can be used for filter design. Calculation of the equivalent circuit is done by one of the following methods:

2) Electromagnetic simulation of the structure (using electromagnetic simulators such as HFSS™) and comparing the result to matching the predicted S-parameters to the S-parameters of an LC equivalent circuit.

3) Measurement of the structure and comparing the result to match the equivalent circuit.

[

Tuning

Figure 40A:
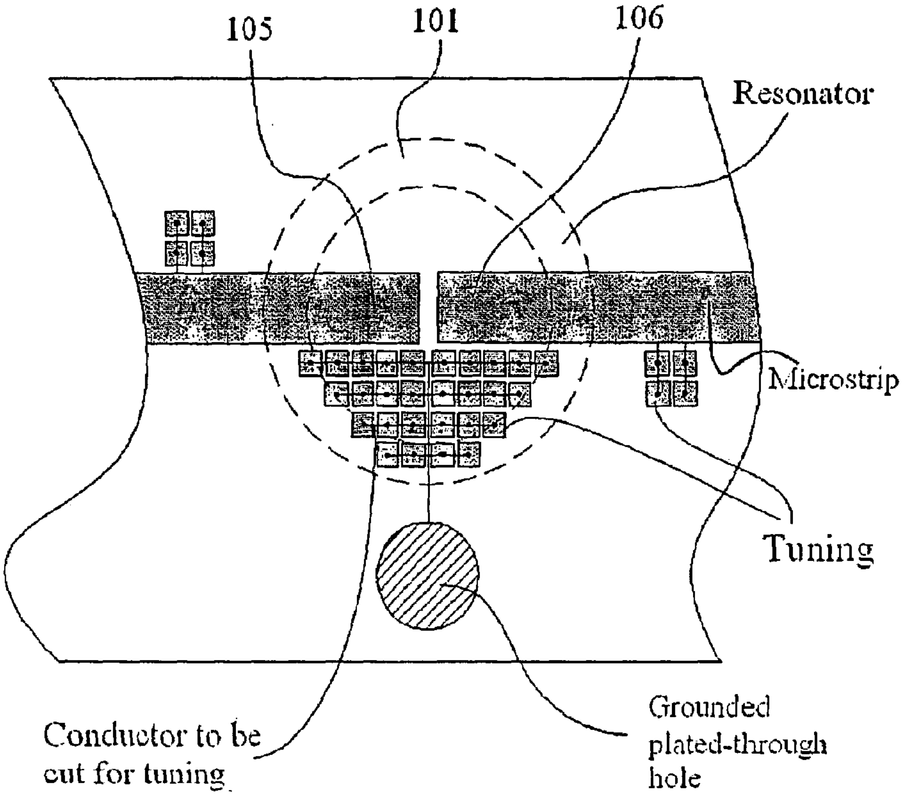
FIG. 40*a* depicts the top view for an implementation of a resonator wherein tuning pads are utilized.

There are secondary effects such as the interaction between remote parts of the resonators. Also the manufacturing tolerances especially in case of narrow-band designs play a significant role. Therefore tuning techniques are required. FIG. 40*a* depicts various tuning techniques which could be utilized for circuit board type resonators or other types of substrate such as semiconductors. The patches are attached via thin metalization. These patches provide extra capacitance and are integrated into the layout in provisions to be cut during a tuning procedure. The tuning procedure can be performed by a robot that is fed by a network analyzer measuring parameters of the filter or probing other parameters. The cuts can be done by laser beam controlled by a robotically. Patches provide capacitors and by cutting them of the resonance frequency of the resonator is increased. Also, the fingers of inter-digital or inter-spiral capacitors which are used for coupling between the resonators or into the resonator can be trimmed in order to decrease the coupling.

Use of the Resonator in a Filter

The resonator could be used in structures such as resonator coupled fileres described in "electronic Design Handbook" By "Arthur B. Williams and Fred J. Taylor, second edition, Page 5-19 through 5-33.

What is claimed is:

1. A microwave filter having a resonator comprising:

a cylindrical structure having conductive walls filled with a dielectric material, said cylindrical structure recessed inside a multi-layered substrate;

a first and second conductive coupling arms disposed on top layer of said substrate for coupling signals to said cylindrical structure, said conductive coupling arms being physically separated from said cylindrical structure by a dielectric layer, said first and second conductive coupling arms extending away from the center of said cylindrical structure to form a microstrip line;

said cylindrical structure further comprising a bottom portion having a solid conductive bottom plate perpendicular to the axis of the cylinder; and a bottom conductive ground layer separated from said conductive bottom plate by a second dielectric layer.

2. A device as in claim 1, wherein high coupling to the cylindrical structure is obtained in which the top portion of the cylindrical structure is attached to another flat structure such as an annular ring extending out from the edge of the cylindrical structure.

3. A device as in claim 1 wherein said bottom conductive ground layer is connected to the ground plane and said coupling arms include discontinuities such as a gap or interdigital capacitor or a circuit component.

4. A device as in claim 1 wherein said cylindrical structure has any arbitrary cross section such as circular, elliptical, rectangular, or ridged.

5. A device as in claim 1 wherein said coupling arms have a separate ground which is substantially closer to said coupling arm and is about the same level as the edges of said cylindrical structure.

6. A device as in claim 1 wherein said coupling arms include matching stubs.

7. A device as in claim 1 wherein said coupling arms are extended above said cylindrical structure forming an interdigital capacitor.

8. A device as in claim 1 wherein said coupling arms above said cylindrical structure are separated by a diagonal slot.

9. A device as in claim 1 wherein said coupling arms are loops.

10. A device as in claim 1 wherein said coupling arms have a spiral shape.

11. A device as in claim 1 wherein the matching network includes an interdigital capacitor implemented on said coupling arms.

12. A device as in claim 1 wherein one of said coupling arms is located on top of said cylindrical structure and another of coupling arms is located on the bottom of said cylindrical structure.

13. A device as in claim 1 wherein said cylindrical structure is divided into two separate structures in which one cylinder is placed above and the other cylinder is placed below said coupling arms.

14. A device as in claim 1 wherein said cylindrical structure includes two ridges which are located substantially close to each other and said coupling arms are located above said two ridges separated by said dielectric layer.

15. A device as in claim 14 wherein said coupling arms are connected to a point on said two ridges.

16. A device as in claim 1 wherein the metallization on the bottom of said cylindrical structure is extended outside of the immediate area of said cylindrical structure in order to obtain more coupling between said cylindrical structure and the ground.

17. A device as in claim 1 wherein frequency tuning is accomplished by disengaging or adding tuning pads which are located in the area above said cylindrical structure or near said coupling arms.

18. A device as in claim 1, wherein frequency tuning is accomplished by changing the location of a metallic or dielectric screw that extends in the space inside said cylindrical structure.

19. A device as in claim 1, wherein said coupling arms are constructed of at least one of the following: coplanar waveguide, coplanar strip line, inverted microstrip line, suspended microstrip line, or three layer microstrip composite.

20. A device as in claim 1, wherein said substrate is comprised of semiconductor circuit board material.

21. A device as in claim 1, wherein said substrate is comprised of semiconductor substrate material.

22. A device as in claim 1, wherein said substrate is comprised of c material.

23. A microwave filter having a resonator comprising:

a cylindrical structure having conductive walls filled with a conductor, said cylindrical structure recessed inside a multi-layered substrate;

a first and second conductive coupling arms disposed on top layer of said substrate, said conductive coupling arms being physically separated from said cylindrical structure by a dielectric layer, said first and second conductive coupling arms extending away from the center of said cylindrical structure to form a microstrip line;

said cylindrical structure further comprising a bottom portion having a solid conductive bottom plate perpendicular to the axis of said cylindrical structure; and a bottom conductive ground layer separated from said conductive bottom plate by a second dielectric layer.

* * * * *